(12) United States Patent
Inoue et al.

(10) Patent No.: US 6,759,876 B2
(45) Date of Patent: Jul. 6, 2004

(54) SEMICONDUCTOR INTEGRATED CIRCUIT

(75) Inventors: Genichiro Inoue, Osaka (JP); Junichi Yano, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/327,046

(22) Filed: Dec. 24, 2002

(65) Prior Publication Data
US 2003/0122581 A1 Jul. 3, 2003

(30) Foreign Application Priority Data
Dec. 28, 2001 (JP) ........................................ 2001-400655

(51) Int. Cl.[7] .............................................. H03K 19/096
(52) U.S. Cl. .............................. 326/98; 326/95; 326/93; 326/121; 327/208; 327/214
(58) Field of Search ................................ 326/93, 95, 98, 326/83, 112, 121; 327/208–212, 214, 215, 224, 225

(56) References Cited

U.S. PATENT DOCUMENTS 5,677,641 A * 10/1997 Nishio et al. ............... 326/121
6,075,386 A * 6/2000 Naffziger .................... 326/98
6,362,659 B1 * 3/2002 Fulkerson .................. 326/121
6,411,149 B1   6/2002 Ooishi
6,424,174 B1   7/2002 Nowak et al.
6,486,706 B2 * 11/2002 Ye et al. ..................... 326/98
2002/0070758 A1   6/2002 Krishnamurthy et al.

OTHER PUBLICATIONS

Atila Alvandpour et al., "A Conditional Keeper Technique for Sub–0.13μWide Dynamic Gates", IEEE, 2001 Symposium on VLSI Circuits Digest of Technical Papers, 2001.

* cited by examiner

Primary Examiner—Vibol Tan
(74) Attorney, Agent, or Firm—McDermott, Will & Emery

(57) ABSTRACT

The semiconductor integrated circuit of this invention includes a first transistor for setting a first node at a first logic level in accordance with a clock signal; an input circuit for setting the first node at a second logic level in accordance with an input signal; a second transistor for setting a second node at the first logic level when the first node is at the first logic level; a resistor device connected between the first node and the second node; a first driving transistor for receiving, as an input, potential of the second node and controlling whether or not an output node is set at the first logic level; and a second driving transistor for receiving, as an input, a signal at a logic level identical to the logic level of the first node and controlling whether or not the output node is set at the second logic level.

24 Claims, 12 Drawing Sheets

US 6,759,876 B2

SEMICONDUCTOR INTEGRATED CIRCUIT

BACKGROUND OF THE INVENTION

The present invention relates to a semiconductor integrated circuit, and more particularly, it relates to a logic circuit.

In recent semiconductor integrated circuits, a high operation speed, area reduction, small power consumption and the like have been realized by refining the fabrication processes. When the gate length of a transistor is reduced by refining the process, a drain current per unit gate width of the transistor flowing when the transistor is in an on state is advantageously increased. On the other hand, a leakage current flowing between the drain and the source when the transistor is in an off state (hereinafter referred to as the subthreshold current) is disadvantageously increased. The increase ratio of the subthreshold current involved in the refinement is larger than the increase ratio of the drain current flowing when the transistor is in an on state.

FIG. 11 is a circuit diagram for showing an example of conventional dynamic semiconductor integrated circuits. The circuit of FIG. 11 includes PMOS transistors 2101 and 2102, an input circuit 2120 and an output circuit 2130. The input circuit 2120 includes NMOS transistors 2121 and 2122, and the output circuit 2130 includes a PMOS transistor 2131 and an NMOS transistor 2132. The circuit of FIG. 11 obtains and outputs a logical OR between input signals VI1 and VI2.

A period when a clock signal CLK is at "L" level (namely, at a low logic level) corresponds to a precharge period. In this period, the PMOS transistor 2101 is turned on so as to precharge a node N211. The input signals VI1 and VI2 are kept at "L" level.

A period when the clock signal CLK is at "H" level (namely, a high logic level) corresponds to an evaluation period. In this period, the input signals VI1 and VI2 are activated. When one of the input signals VI1 and VI2 undergoes a "L" to "H" transition, the node N211 is discharged, and hence, an output signal V21 undergoes a "L" to "H" transition. When both the input signals VI1 and VI2 are at "L" level, the node N211 is not discharged, and hence, the output signal V21 is at "L" level. At this point, the PMOS transistor 2102 is in an on state so as to keep the potential of the node N211 at "H" level.

FIG. 12 is a circuit diagram for showing an example of conventional static semiconductor integrated circuits. The circuit of FIG. 12 functions as a buffer circuit in which two stages of inverters are serially connected to each other. The circuit of FIG. 12 includes an inverter having a PMOS transistor 2231 and an NMOS transistor 2232, and an inverter having a PMOS transistor 2281 and an NMOS transistor 2282.

With respect to the dynamic circuit having the configuration shown in FIG. 11, the case where the subthreshold current flowing when a transistor is in an off state becomes too large to ignore as compared with the drain current flowing when the transistor is in an on state will now be described.

In the evaluation period, even when both the input signals VI1 and VI2 are at "L" level, the subthreshold current flows through the NMOS transistors 2121 and 2122. At this point, the current flows from the power supply through the PMOS transistor 2102 and the NMOS transistor 2121 or 2122 to a ground line. In this case, the potential of the node N211 is lower than supply potential VDD by a voltage Vd.

At this point, when the voltage Vd is smaller than the threshold voltage Vt (that is, a gate-source voltage obtained when a transistor is switched from an off state to an on state) of the PMOS transistor 2131, the PMOS transistor 2131 is turned off and the NMOS transistor 2132 is turned on, so that the output signal V21 can be at "L" level. The potential of this output signal V21 is higher than ground potential VSS. Assuming that the PMOS transistor 2131 has a resistance value R2131 and the NMOS transistor 2132 has a resistance value r2132, a shift Vdo of the potential of the output signal V21 from the ground potential VSS is VDD*r2132/(R2131+r2132).

Alternatively, when the voltage Vd is larger than the threshold voltage Vt of the PMOS transistor 2131, this transistor is turned on. Since both the PMOS transistor 2131 and the NMOS transistor 2132 are in an on state, not only the output is undefined but also a large through current unavoidably flows through these transistors.

Also in the precharge period, when the subthreshold current flows through the NMOS transistors 2121 and 2122, the potential of the node N211 becomes lower than the supply potential VDD, and hence, a similar problem occurs.

Since the subthreshold current has a property to exponentially increase against the gate-source voltage Vgs of the transistor, when the gate-source voltage Vgs of the PMOS transistor 2131 is equal to the voltage Vd, a larger current flows through this transistor than when the voltage Vgs is 0, which increases the shift Vdo of the potential of the output signal V21.

In this manner, when the subthreshold current is too large to ignore, the shift of the potential of the output signal V21, namely, DC noise to be output, becomes too large to ignore. In particular, when DC noise included in an output signal is larger than DC noise included in an input signal, this means that the DC noise is amplified.

Such a phenomenon is described in "A Conditional Keeper Technique for Sub-0.13μ Wide Dynamic Gates" (Atila Alvandpour et. al., 2001 Symposium on VLSI Circuits Digest of Technical Papers 3–4).

When a plurality of such circuits that amplify DC noise included in an input signal are serially connected to one another, the DC noise is gradually increased, resulting in the malfunction of the circuit. Also, even when the circuit does not amplify DC noise, if the voltage Vd and the shift Vdo of the potential of the output signal V21 are large, a leakage current flowing between the power supply and the ground line is exponentially increased, and hence, the power consumed when the transistor is in an off state becomes disadvantageously large.

Also in the static circuit having the configuration shown in FIG. 12, in the case where the subthreshold current flowing when a transistor is in an off state is too large to ignore as compared with the drain current flowing when the transistor is in an on state, a similar problem occurs.

Specifically, since the subthreshold current flows through the PMOS transistor 2231, even when an input signal VI is at "H" level, the potential of the node N221 is higher than the ground potential VSS. Therefore, the potential of an output signal V22 is lower than the supply potential VDD, namely, the output signal V22 includes DC noise. When DC noise included in the output signal is larger than DC noise included in the input signal, this means that the DC noise is amplified. Also when a plurality of such circuits that amplify DC noise included in an input signal are serially connected to one another, the malfunction of the circuit is caused.

SUMMARY OF THE INVENTION

An object of the invention is providing a semiconductor integrated circuit for outputting a signal with small DC noise.

Specifically, the first semiconductor integrated circuit of this invention includes a first transistor for setting a first node at a first logic level in accordance with a clock signal; an input circuit for setting the first node at a second logic level different from the first logic level in accordance with an input signal; a second transistor for setting a second node at the first logic level when the first node is at the first logic level; a first resistor device that is connected between the first node and the second node and has a large resistance value when the first node is at the first logic level and has a small resistance value when the first node is at the second logic level; a first driving transistor for receiving, as an input, potential of the second node and controlling whether or not an output node is set at the first logic level; and a second driving transistor for receiving, as an input, a signal at a logic level identical to the logic level of the first node and controlling whether or not the output node is set at the second logic level.

In this semiconductor integrated circuit, owing to the first resistor device, the absolute value of the gate-source voltage of the first driving transistor in an off state can be made small. Therefore, in a dynamic circuit operated in synchronization with a clock signal, the subthreshold current of the first driving transistor can be reduced, so that DC noise included in an output signal can be reduced.

In the first semiconductor integrated circuit, the second transistor preferably sets the second node at the first logic level in accordance with the clock signal.

The first semiconductor integrated circuit preferably further includes an inverter for inverting the logic level of the first node and outputting the inverted logic level, and the second transistor preferably receives, as an input, an output signal of the inverter and sets the second node at the first logic level when the first node is at the first logic level.

The first semiconductor integrated circuit preferably further includes a third transistor that receives, as an input, potential of the output node and sets the second node at the first logic level when the output node is at the second logic level.

The first semiconductor integrated circuit preferably further includes a third transistor that receives, as an input, potential of the output node and sets the first node at the first logic level when the output node is at the second logic level.

The first semiconductor integrated circuit preferably further includes an inverter for inverting the logic level of the first node and outputting the inverted logic level; and a third transistor that receives, as an input, an output signal of the inverter and keeps a logic level of the first node when the first node is at the first logic level.

The first semiconductor integrated circuit preferably further includes a third driving transistor that receives, as an input, potential of the first node and controls whether or not the output node is set at the first logic level.

In the first semiconductor integrated circuit, the first resistor device is preferably a transistor whose gate and drain are connected to each other.

The first semiconductor integrated circuit preferably further includes an inverter for inverting the logic level of the first node and outputting the inverted logic level; a third transistor that receives, as an input, an output signal of the inverter and sets a third node at the second logic level when the first node is at the second logic level; and a second resistor device that is connected between the first node and the third node and has a small resistance value when the first node is at the first logic level and has a large resistance value when the first node is at the second logic level, and the second driving transistor preferably receives, as an input, potential of the third node.

Thus, owing to the second resistor device, the absolute value of the gate-source voltage of the second driving transistor in an off state can be made small. Therefore, the subthreshold current of the second driving transistor can be reduced, so that DC noise included in the output signal can be reduced.

The first semiconductor integrated circuit preferably further includes a third driving transistor that receives, as an input, potential of the first node and controls whether or not the output node is set at the second logic level.

In the first semiconductor integrated circuit, the second resistor device is preferably a transistor whose gate and drain are connected to each other.

The first semiconductor integrated circuit preferably further includes a third transistor that receives the clock signal as an input, is connected in series to the input circuit and is turned on when the clock signal is at the first logic level.

Preferably, the first semiconductor integrated circuit is plural in number, and the first and second driving transistors included in the plural semiconductor integrated circuits together construct one logic circuit.

The second semiconductor integrated circuit of this invention includes a first transistor for setting a first node at a first logic level when an input node is at the first logic level; a first resistor device that is connected between the input node and the first node and has a large resistance value when the input node is at the first logic level and has a small resistance value when the input node is at a second logic level different from the first logic level; a first driving transistor for receiving, as an input, potential of the first node and controlling whether or not an output node is set at the first logic level; and a second driving transistor for receiving, as an input, a signal at a logic level identical to the logic level of the input node and controlling whether or not the output node is set at the second logic level.

In this semiconductor integrated circuit, owing to the first resistor device, the absolute value of the gate-source voltage of the first driving transistor in an off state can be made small. Therefore, the subthreshold current of the first driving transistor can be reduced, so that DC noise included in an output signal can be reduced.

The second semiconductor integrated circuit preferably further includes an inverter for inverting the logic level of the input node and outputting the inverted logic level, and the first transistor preferably receives, as an input, an output signal of the inverter and sets the first node at the first logic level when the input node is at the first logic level.

The second semiconductor integrated circuit preferably further includes a third driving transistor for receiving, as an input, potential of the input node and controlling whether or not the output node is set at the first logic level.

In the second semiconductor integrated circuit, the first resistor device is preferably a transistor whose gate and drain are connected to each other.

The second semiconductor integrated circuit preferably further includes an inverter for inverting the logic level of the input node and outputting the inverted logic level; a second transistor for receiving, as an input, an output signal of the inverter and setting the second node at the second logic level when the input node is at the second logic level; and a second resistor device that is connected between the input node and the second node and has a small resistance value when the input node is at the first logic level and has a large resistance value when the input node is at the second logic level, and the second driving transistor preferably receives, as an input, potential of the second node.

The second semiconductor integrated circuit preferably further includes a third driving transistor for receiving, as an input, potential of the input node and controlling whether or not the output node is set at the second logic level.

In the second semiconductor integrated circuit, the second resistor device is preferably a transistor whose gate and drain are connected to each other.

Preferably, the second semiconductor integrated circuit is plural in number, and the first and second driving transistors included the plural semiconductor integrated circuits together construct one logic circuit.

In the first or second semiconductor integrated circuit, it is preferred that the first logic level corresponds to a high logic level and that the second logic level corresponds to a low logic level.

In the first or second semiconductor integrated circuit, it is preferred that the first logic level corresponds to a low logic level and that the second logic level corresponds to a high logic level.

DETAILED DESCRIPTION OF THE INVENTION

Preferred embodiments of the invention will now be described with reference to the accompanying drawings.
Embodiment 1

Figure 1:
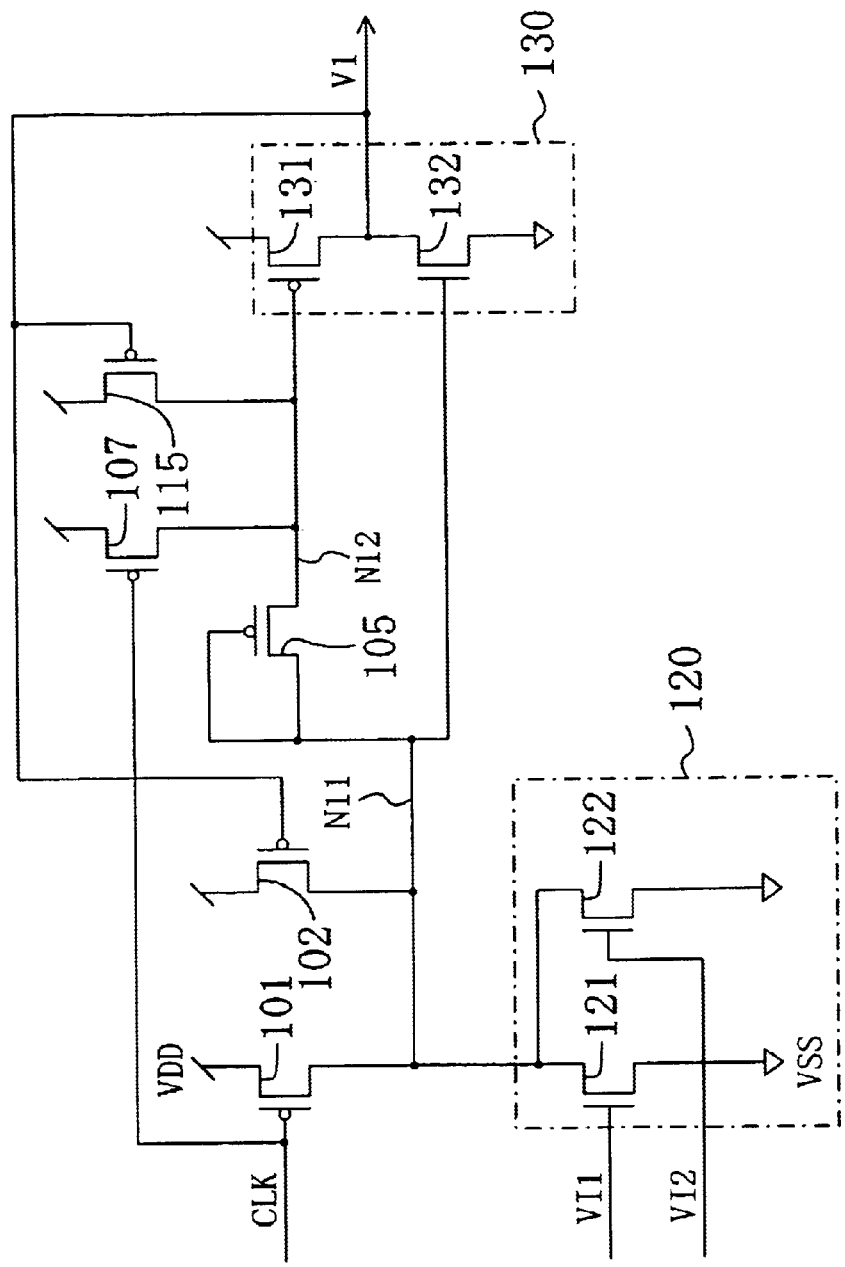
FIG. 1 is a circuit diagram of a semiconductor integrated circuit according to Embodiment 1 of the invention.

FIG. 1 is a circuit diagram of a semiconductor integrated circuit according to Embodiment 1 of the invention. The semiconductor integrated circuit of FIG. 1 includes PMOS transistors (p-type MOSFETs (Metal Oxide Semiconductor Field-Effect Transistors)) 101, 102, 105, 107 and 115, an input circuit 120 and an output circuit 130. The input circuit 120 includes NMOS transistors (n-type MOSFETs) 121 and 122. The output circuit 130 includes a PMOS transistor 131 and an NMOS transistor 132. The PMOS transistors 101 and 107 respectively work as first and second transistors. The PMOS transistor 131 and the NMOS transistor 132 respectively work as first and second driving transistors.

The source of the PMOS transistor 101 is supplied with supply potential VDD and the gate thereof is supplied with a clock signal CLK. The drain of the PMOS transistor 101 corresponds to a first node N11. The PMOS transistor 101 is turned on when the clock signal CLK is at a low logic level (hereinafter referred to "L" level), so as to precharge the first node N11 to potential in the vicinity of the supply potential VDD. When precharged, the node N11 changes in potential to a high logic level (hereinafter referred to "H" level). Herein, the high logic level corresponds to a first logic level and the low logic level corresponds to a second logic level.

The source of the NMOS transistor 121 is supplied with ground potential VSS and the gate thereof is supplied with an input signal VI1. The source of the NMOS transistor 122 is supplied with the ground potential VSS and the gate thereof is supplied with an input signal VI2. The drains of the NMOS transistors 121 and 122 are connected to the first node N11. The input signals VI1 and VI2 are activated when the clock signal CLK is at "H" level and are fixed to "L" level when the clock signal CLK is at "L" level. The NMOS transistors 121 and 122 discharge the first node N11 to potential in the vicinity of the ground potential VSS (namely, potential at "L" level) respectively when the input signals VI1 and VI2 are at "H" level. In other words, the input circuit 120 works as an OR circuit.

The PMOS transistor 102 has small driving power (i.e., a small saturation current), and the gate thereof is supplied with an output signal V1 of the circuit of FIG. 1 and the source thereof is supplied with the supply potential VDD. The drain of the PMOS transistor 102 is connected to the node N11. The PMOS transistor 102 precharges the node N11 to potential in the vicinity of the supply potential VDD (namely, potential at "H" level) when the output signal V1 is at "L" level.

The PMOS transistor 102 keeps the node N11 at the potential in the vicinity of the supply voltage VDD when both the NMOS transistors 121 and 122 are in an off state. On the other hand, in order to discharge the node N11 to the potential in the vicinity of the ground potential VSS within predetermined time when at least one of the NMOS transistors 121 and 122 is turned on, the driving power of the PMOS transistor 102 is adjusted to approximately ⅒ or less of that of the NMOS transistors 121 and 122.

The source of the PMOS transistor 107 is supplied with the supply potential VDD and the gate thereof is supplied with the clock signal CLK. The drain of the PMOS transistor 107 corresponds to a second node N12. The PMOS transistor 107 precharges the node N12 to the potential in the vicinity of the supply potential VDD when the clock signal CLK is at "L" level. The first and second nodes N11 and N12 are also designated as precharge lines.

The gate and the drain of the PMOS transistor 105 are connected to the node N11, and the source thereof is connected to the drain of the PMOS transistor 107, namely, the node N12. When the node N11 has the potential in the vicinity of the ground potential VSS, the PMOS transistor 105 is turned on, so that the source and the drain thereof can be electrically connected to each other. Since the resistance between the source and the drain is thus reduced, the potential of the node N11 is transmitted to the node N12. At this point, the potential of the node N12 becomes higher than that of the node N11 approximately by a voltage Vtp1. The voltage Vtp1 corresponds to the threshold voltage of the PMOS transistor 105. When the node N11 has the potential in the vicinity of the supply potential VDD, the PMOS transistor 105 is turned off, so that the source and the drain thereof cannot be electrically connected to each other. In other words, the resistance between the source and the drain is increased. In this manner, the PMOS transistor 105 works as a resistor device connected between the first node N11 and the second node N12.

The PMOS transistor 115 has small driving power (i.e., a small saturation current), and the gate thereof is supplied with the output signal V1 and the source thereof is supplied with the supply potential VDD. The drain of the PMOS transistor 115 is connected to the node N12. The PMOS transistor 115 precharges the node N12 to the potential in the vicinity of the supply potential VDD when the output signal V1 is at "L" level.

The PMOS transistor 115 keeps the second node N12 at the potential in the vicinity of the supply potential VDD when the PMOS transistor 105 is in an off state. On the other hand, in order to discharge the node N12 to the potential in the vicinity of the ground potential VSS within predetermined time when at least one of the NMOS transistors 121 and 122 and the PMOS transistor 105 are simultaneously turned on, the driving power of the PMOS transistor 115 is adjusted to approximately 1/10 or less of that of the NMOS transistors 121 and 122 and the PMOS transistor 105.

The source of the PMOS transistor 131 is supplied with the supply potential VDD and the gate thereof is connected to the node N12. The drain of the PMOS transistor 131 is connected to the drain of the NMOS transistor 132. The drain of the PMOS transistor 131 corresponds to an output node for outputting the output signal V1. When the node N12 has the potential in the vicinity of the ground potential VSS, the source and the drain of the PMOS transistor 131 are electrically connected to each other, so as to set the output signal V1 at "H" level.

The source of the NMOS transistor 132 is supplied with the ground potential VSS and the gate thereof is connected to the drain of the PMOS transistor 101, namely, the node N11. When the node N11 has the potential in the vicinity of the supply potential VDD, the source and the drain of the NMOS transistor 132 are electrically connected to each other, so as to set the output signal V1 at "L" level.

Now, the operation of the semiconductor integrated circuit of FIG. 1 will be described. The semiconductor integrated circuit of FIG. 1 is a kind of dynamic circuits, in which a period when the clock signal CLK is at "L" level is designated as a precharge period and a period when it is at "H" level is designated as an evaluation period. The semiconductor integrated circuit of FIG. 1 outputs, as the output signal V1, a logical OR between the input signals VI1 and VI2 that are activated in the evaluation period.

First, the operation of the semiconductor integrated circuit performed in the precharge period will be described in detail. In the precharge period, the clock signal CLK is at "L" level, and hence, the PMOS transistor 101 is turned on. In this period, the input signals VI1 and VI2 are fixed to "L" level, and hence, the NMOS transistors 121 and 122 are in an off state. Therefore, the node N11 is precharged to the potential in the vicinity of the supply potential VDD, and hence, the PMOS transistor 105 is turned off. Since the PMOS transistor 107 is also turned on in the precharge period, the node N12 is precharged to the potential in the vicinity of the supply potential VDD.

Since both the node N11 and the node N12 have the potential in the vicinity of the supply potential VDD, the PMOS transistor 131 is turned off and the NMOS transistor 132 is turned on. Accordingly, the output signal V1 is at "L" level. At this point, the PMOS transistors 102 and 115 are also turned on.

However, although the NMOS transistors 121 and 122 and the PMOS transistor 105 are in an off state, the subthreshold current flows between the source and the drain of each of these transistors. The currents flowing at this point includes a current flowing from the PMOS transistors 101 and 102 to the NMOS transistors 121 and 122 and a current flowing from the PMOS transistors 107 and 115 through the PMOS transistor 105 to the NMOS transistors 121 and 122. Therefore, the respective potential VP11 and VP12 of the nodes N11 and N12 obtained in the precharge period are both lower than the supply potential VDD.

At this point, the potential VP12 of the node N12 is higher than the potential VP11 of the node N11 by (VDD−VP11) *R105/(RP+R105). The PMOS transistors 107 and 115 are connected to each other through their sources and their drains as shown in FIG. 1. A resistance value RP corresponds to a resistance value of a circuit in which the PMOS transistors 107 and 115 are thus connected to each other in parallel, and is a resistance value attained when these transistors are both in an on state. Specifically, assuming that the resistances between the sources and the drains of the PMOS transistors 107 and 115 in an on state respectively have resistance values r107 and r115, RP=r107*r115/(r107+ r115). The resistance value R105 corresponds to a resistance value between the source and the drain of the PMOS transistor 105 in an off state.

Since the resistance value R105 can be easily made larger than the resistance value RP, the gate potential of the PMOS transistor 131 can be made closer to the supply potential VDD than that obtained when this gate is directly connected to the node N11. Accordingly, the subthreshold current of the PMOS transistor 131 can be reduced.

In general, the subthreshold current of a PMOS transistor in an off state is exponentially changed against the source-gate voltage Vgs. In other words, since a drain-source current Ids=Isa*EXP (Vgs/n*Ur)*(1−EXP (−Vgs/Ur)), the subthreshold current can be effectively reduced by making the gate potential closer to the supply potential VDD even slightly (wherein Ur=kT/q, n=(1+Cd/Cox), k is the Boltzmann's constant, T is an absolute temperature, q is charge of an electron, Cd is depletion layer capacity, and Cox is gate capacity).

In other words, as compared with the case where the gate of the PMOS transistor 131 is directly connected to the node N11, the resistance value R131 between the source and the drain of the PMOS transistor 131 in an off state can be increased. When the resistance between the source and the drain of the NMOS transistor 132 in an on state has a resistance value r132, the potential of the output signal V1 is VDD*r132/(R131+r132). Therefore, in the circuit of FIG. 1, the potential of the output signal V1 can be made closer to the ground potential VSS, namely, DC noise included in the output signal V1 can be reduced.

Next, the operation of the semiconductor integrated circuit of FIG. 1 performed in the evaluation period will be described in detail. In the evaluation period, the clock signal CLK is at "H" level, and hence, the PMOS transistors 101 and 107 are in an off state. Since the output signal V1 is at "L" level in the precharge period, the PMOS transistors 102 and 115 are in an on state, the node N11 is being weakly precharged by the PMOS transistor 102 and the node N12 is being weakly precharged by the PMOS transistor 115.

In the evaluation period, both the input signals VI1 and VI2 are activated. In the case where both the input signals VI1 and VI2 are at "L" level, both the NMOS transistors 121 and 122 are turned off. Since the node N11 is weakly precharged by the PMOS transistor 102, it keeps the potential in the vicinity of the supply potential VDD. Since the potential of the node N11 is high, the PMOS transistor 105 is turned off. Since the node N12 is weakly precharged by the PMOS transistor 115, it keeps the potential in the vicinity of the supply potential VDD.

Since both the nodes N11 and N12 have the potential in the vicinity of the supply potential VDD, the PMOS transistor 131 is turned off and the NMOS transistor 132 is turned on, and hence, the output signal V1 is at "L" level. Accordingly, both the PMOS transistors 102 and 115 remain to be in an on state.

However, although the NMOS transistors 121 and 122 are in an off state, the subthreshold current flows between the drain and the source of each of these transistors. Also, although the PMOS transistors 101, 107 and 105 are in an off state, the subthreshold current flows between the source and the drain of each of these transistors.

The currents flowing at this point include a current flowing from the PMOS transistors 101 and 102 to the NMOS transistors 121 and 122 and a current flowing from the PMOS transistors 107 and 115 through the PMOS transistor 105 to the NMOS transistors 121 and 122. Therefore, the respective potential VE11 and VE12 of the nodes N11 and N12 are both lower than the supply potential VDD.

At this point, the potential VE12 of the node N12 is higher than the potential VE11 of the node N11 by (VDD−VE11)*R105/(RE1+R105), wherein a resistance value RE1 is a resistance value of a circuit in which the PMOS transistors 107 and 115 are connected to each other in parallel as shown in FIG. 1 and is a value obtained when the PMOS transistor 115 alone is in an on state. In other words, when the PMOS transistor 107 in an off state has a resistance value R107, RE1=R107*r115/(R107+r115).

Since the resistance value R105 can be easily made larger than the resistance value RE1, the gate potential of the PMOS transistor 131 can be made closer to the supply potential VDD than that obtained when this gate is directly connected to the node N11. Accordingly, the subthreshold current of the PMOS transistor 131 can be reduced.

In other words, as compared with the case where the gate of the PMOS transistor 131 is directly connected to the node N11, the resistance value R131 between the source and the drain of the PMOS transistor 131 in an off state can be increased. Accordingly, in the circuit of FIG. 1, the potential of the output signal V1 can be made closer to the ground potential VSS, namely, DC noise included in the output signal V1 can be reduced.

In the case where both the input signals VI1 and VI2 are at "H" level in the evaluation period, both the NMOS transistors 121 and 122 are turned on. Although the PMOS transistor 102 is in an on state, its power to allow a current to flow is so small that the node N11 is discharged by the NMOS transistors 121 and 122 to the potential in the vicinity of the ground potential VSS. Since the node N11 changes in potential to the low potential in the vicinity of the ground potential VSS, the PMOS transistor 105 is turned on. Although the PMOS transistor 115 is in an on state, its power to allow a current to flow is so small that the node N12 is discharged. The node N12 attains potential higher than the potential of the node N11 approximately by the threshold voltage Vtp1 of the PMOS transistor 105.

Since the potential of the nodes N11 and N12 are both at "L" level, the PMOS transistor 131 is turned on and the NMOS transistor 132 is turned off, and the output signal V1 is at "H" level. Therefore, the PMOS transistors 102 and 115 are turned off, and the potential of the nodes N11 and N12 are further lowered to a steady state. Since the gate potential of the PMOS transistor 131 is slightly high, the driving power of this transistor is reduced, which does not lead to a significant problem.

The case where both the input signals VI1 and VI2 undergo a "L" to "H" transition is described above, and the operation is substantially the same in the case where one of the input signals VI1 and VI2 undergoes a "L" to "H" transition, and therefore, the description is omitted.

As described above, the semiconductor integrated circuit of FIG. 1 is a kind of dynamic circuits in which the period when the clock signal CLK is at "L" level is the precharge period and the period when it is at "H" level is the evaluation period, and outputs, as the output signal V1, the logical OR between the input signals VI1 and VI2 activated in the evaluation period.

The gate of the PMOS transistor 131 for driving the output node to "H" level is connected not to the node N11 but to the node N12. The PMOS transistor 105 is connected between the node N11 and the node N12, and the PMOS transistor 105 is turned off (namely, the resistance between the source and the drain thereof is increased) when the node N11 has the potential in the vicinity of the supply potential VDD, namely, the potential at "H" logic level. When DC noise is superposed upon the input signals VI1 and VI2 when they are at "L" level, the NMOS transistor 121 or 122 is turned on, so as to lower the potential of the node N11. Even in this case, the potential of the node N12 can be higher than the potential of the node N11, and therefore, the PMOS transistor 131 can be kept in an off state.

In this manner, according to the circuit of FIG. 1, in the case where the output signal V1 is at "L" level, the subthreshold current of the PMOS transistor 131 in an off state can be reduced, and therefore, DC noise superposed upon the output signal, namely, a shift of the output signal from a predetermined logic level, can be reduced. Also, even when the input signal includes DC noise, a signal with small DC noise can be output. Accordingly, it is possible to provide a semiconductor integrated circuit that is resistant to DC noise and in which a leakage current flowing in the output circuit is smaller than in a conventional dynamic circuit. In particular, in the case where a plurality of stages of logic circuits are serially connected to one another, malfunction derived from the influence of DC noise can be minimized by employing the semiconductor integrated circuit of FIG. 1.

Also, in the circuit of FIG. 1, even when the clock signal is halted, the leakage current flowing in the output circuit can be reduced, and therefore, the power consumed during standby can be also suppressed.

In this embodiment, the PMOS transistor 105 whose gate and drain are connected to the node N11 and whose source is connected to the node N12 is used as the resistor device. Similarly, any other device that has high resistance when the node N11 has the potential in the vicinity of the supply potential VDD, namely, the potential at "H" level, and has low resistance when the node N11 has the potential in the vicinity of the ground potential VSS, namely, the potential at "L" level, can be used instead of the PMOS transistor 105.

Furthermore, one or both of the PMOS transistors 102 and 115 for respectively precharging the nodes N11 and N12 may be omitted.

Embodiment 2

Figure 2:
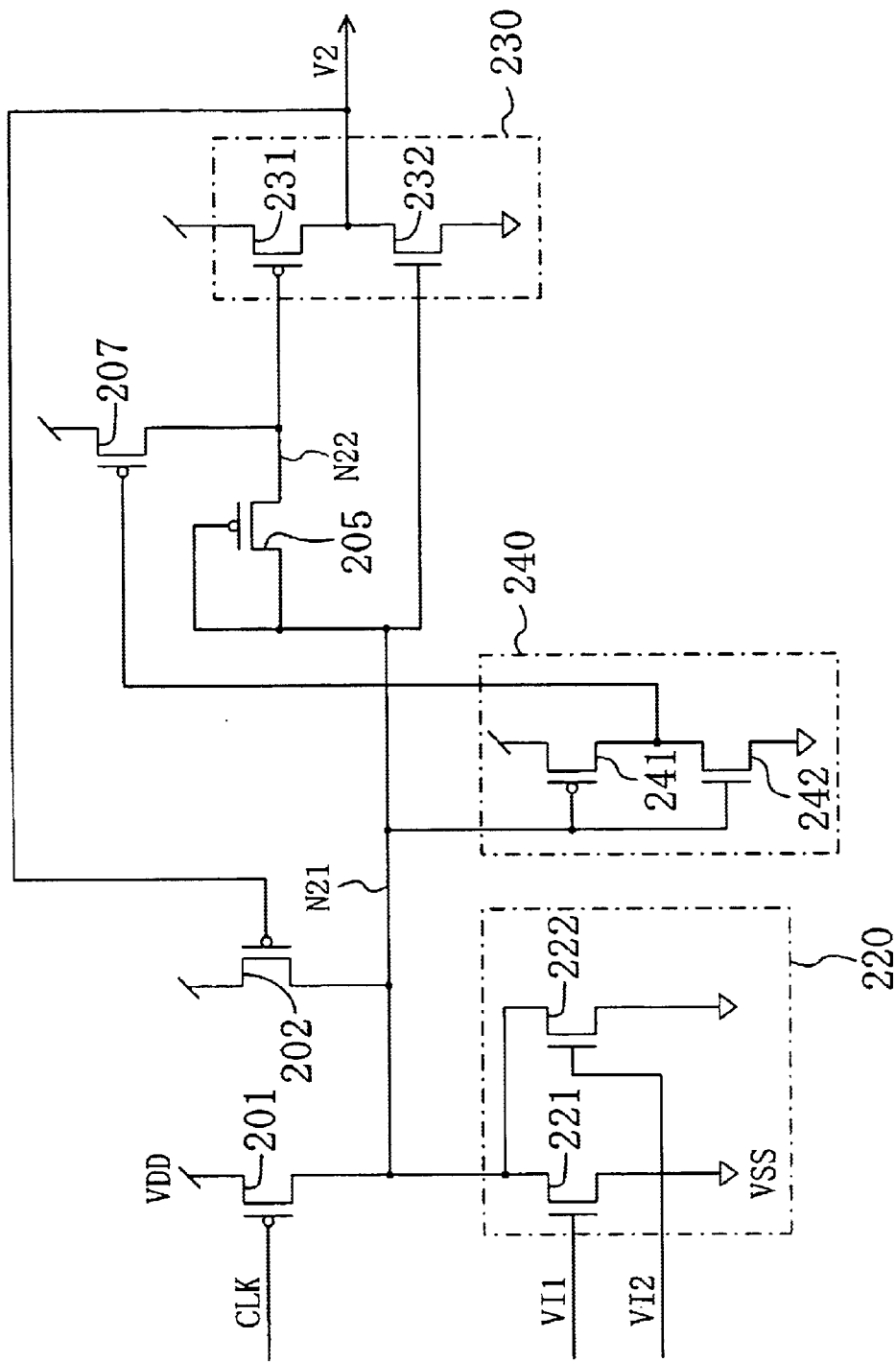
FIG. 2 is a circuit diagram of a semiconductor integrated circuit according to Embodiment 2 of the invention.

FIG. 2 is a circuit diagram of a semiconductor integrated circuit according to Embodiment 2 of the invention. The semiconductor integrated circuit of FIG. 2 can be obtained by additionally including an inverter 240 and omitting the PMOS transistor 115 in the semiconductor integrated circuit of FIG. 1. In FIG. 2, PMOS transistors 201, 202, 205, 207 and 231 are respectively similar to the PMOS transistors 101, 102, 105, 107 and 131 of FIG. 1. An input circuit 220 and an NMOS transistor 232 are respectively similar to the input circuit 120 and the NMOS transistor 132 of FIG. 1. Also, first and second nodes N21 and N22 respectively correspond to the nodes N11 and N12 of FIG. 1. The PMOS transistor 205 works as a resistor device.

The inverter 240 includes a PMOS transistor 241 and an NMOS transistor 242. The source of the PMOS transistor 241 is connected to supply potential VDD, the drain thereof is connected to the drain of the NMOS transistor 242 and the gate thereof is connected to the node N21. The source of the NMOS transistor 242 is connected to ground potential VSS and the gate thereof is connected to the node N21. The drain of the PMOS transistor 241 corresponds to an output node of the inverter 240. The gate of the PMOS transistor 207 is supplied not with a clock signal CLK but with an output signal of the inverter 240.

Next, the operation of the semiconductor integrated circuit of FIG. 2 performed in the precharge period will be described. In the precharge period, since the clock signal CLK is at "L" level, the PMOS transistor 201 is in an on state. In this period, the input signals VI1 and VI2 are fixed to "L" level, and therefore, the NMOS transistors 221 and 222 are in an off state. Therefore, the node N21 is precharged to potential in the vicinity of the supply potential VDD (namely, potential at "L" level), and hence, the PMOS transistor 205 is turned off.

When the node N21 is at "H" level, the output signal of the inverter 240 is at "L" level, and therefore, the PMOS transistor 207 is turned on, so as to precharge the node N22 to the potential in the vicinity of the supply potential VDD.

Since both the node N21 and the node N22 have the potential in the vicinity of the supply potential VDD, an output signal V2 is at "L" level. At this point, the PMOS transistor 202 is also turned on. The subthreshold currents flowing at this point include a current flowing from the PMOS transistors 201 and 202 to the NMOS transistors 221 and 222 and a current flowing from the PMOS transistor 207 through the PMOS transistor 205 to the NMOS transistors 221 and 222. Therefore, the respective potential VP21 and VP22 of the nodes N21 and N22 are both lower than the supply potential VDD.

At this point, the potential VP22 of the node N22 is higher than the potential VP21 of the node N21 by (VDD−VP21) *R205/(r207+R205), wherein a resistance value r207 is a resistance value between the source and the drain of the PMOS transistor 207 in an on state and a resistance value R205 is a resistance value between the source and the drain of the PMOS transistor 205 in an off state.

Since the resistance value R205 can be easily made larger than the resistance value r207, the gate potential of the PMOS transistor 231 can be made closer to the supply potential VDD than that obtained when this gate is directly connected to the node N21. Accordingly, the subthreshold current of the PMOS transistor 231 can be reduced, and the resistance value between the source and the drain of this transistor can be increased, so that the potential of the output signal V2 can be made closer to the ground potential VSS. In other words, in the circuit of FIG. 2, DC noise included in the output signal V2 can be reduced.

Next, the operation of the semiconductor integrated circuit of FIG. 2 performed in the evaluation period will be described. In the evaluation period, the clock signal CLK is at "H" level, and therefore, the PMOS transistor 201 is in an off state. Since the output signal V2 is at "L" level in the precharge period, the PMOS transistor 202 is in an on state and the node N21 is being weakly precharged by the PMOS transistor 202.

In the evaluation period, the input signals VI1 and VI2 are activated. When both the input signals VI1 and VI2 are at "L" level, both the NMOS transistors 221 and 222 are in an off state. Since the node N21 is weakly precharged by the PMOS transistor 202, it keeps the potential in the vicinity of the supply potential VDD. Since the potential of the node N21 is high, the PMOS transistor 205 is turned off. Since the node N22 is precharged by the PMOS transistor 207, it keeps the potential in the vicinity of the supply potential VDD.

Since both the nodes N21 and N22 have the potential in the vicinity of the supply potential VDD, the PMOS transistor 231 is turned off and the NMOS transistor 232 is turned on, and the output signal V2 is at "L" level. Accordingly, the PMOS transistor 202 remains to be in an on state. The subthreshold currents flowing at this point include a current flowing from the PMOS transistors 201 and 202 to the NMOS transistors 221 and 222 and a current flowing from the PMOS transistor 207 through the PMOS transistor 205 to the NMOS transistors 221 and 222. Therefore, the respective potential VE21 and VE22 of the nodes N21 and N22 are both lower than the supply potential VDD.

At this point, the potential of the nodes N21 and N22 are respectively the same as the potentials VP21 and VP22 obtained in the precharge period. Accordingly, in the circuit of FIG. 2, DC noise included in the output signal V2 can be reduced.

In the case where both the input signals VI1 and VI2 undergo a "L" to "H" transition in the evaluation period, both the NMOS transistors 221 and 222 are turned on. Although the PMOS transistor 202 is in an on state, its power to allow a current to flow is so small that the node N21 is discharged by the NMOS transistors 221 and 222 to the potential in the vicinity of the ground potential VSS (namely, potential at "L" level). Since the node N21 thus attains the low potential in the vicinity of the ground potential VSS, the PMOS transistor 205 is turned on. Since the PMOS transistor 207 is in an off state when the node N21 is at "L" level, the node N22 is discharged. Therefore, the potential of the node N22 is higher than that of the node N21 approximately by the threshold voltage Vtp2 of the PMOS transistor 205.

Since both the nodes N21 and N22 have the potential at "L" level, the PMOS transistor 231 is turned on and the NMOS transistor 232 is turned off, and the output signal V2 is at "H" level. Accordingly, the PMOS transistor 202 is turned off, and the potential of the node N21 is further lowered to a steady state. Since the gate potential of the PMOS transistor 231 is slightly high, the driving power of this transistor is reduced, which does not lead to a significant problem.

The case where both the input signals VI1 and VI2 undergo a "L" to "H" transition is described above, and the operation is substantially the same in the case where one of the input signals VI1 and VI2 undergoes a "L" to "H" transition, and therefore, the description is omitted.

In this manner, according to the circuit of FIG. 2, in the case where the output signal V2 is at "L" level, the subthreshold current of the PMOS transistor 231 in an off state can be reduced, and therefore, DC noise superposed upon the output signal can be reduced. Accordingly, it is possible to provide a semiconductor integrated circuit that is resistant to DC noise and in which a leakage current flowing in the output circuit is smaller than in a conventional dynamic circuit.

It is noted that the PMOS transistor 202 for precharging the node N21 can be omitted.

Embodiment 3

Figure 3:
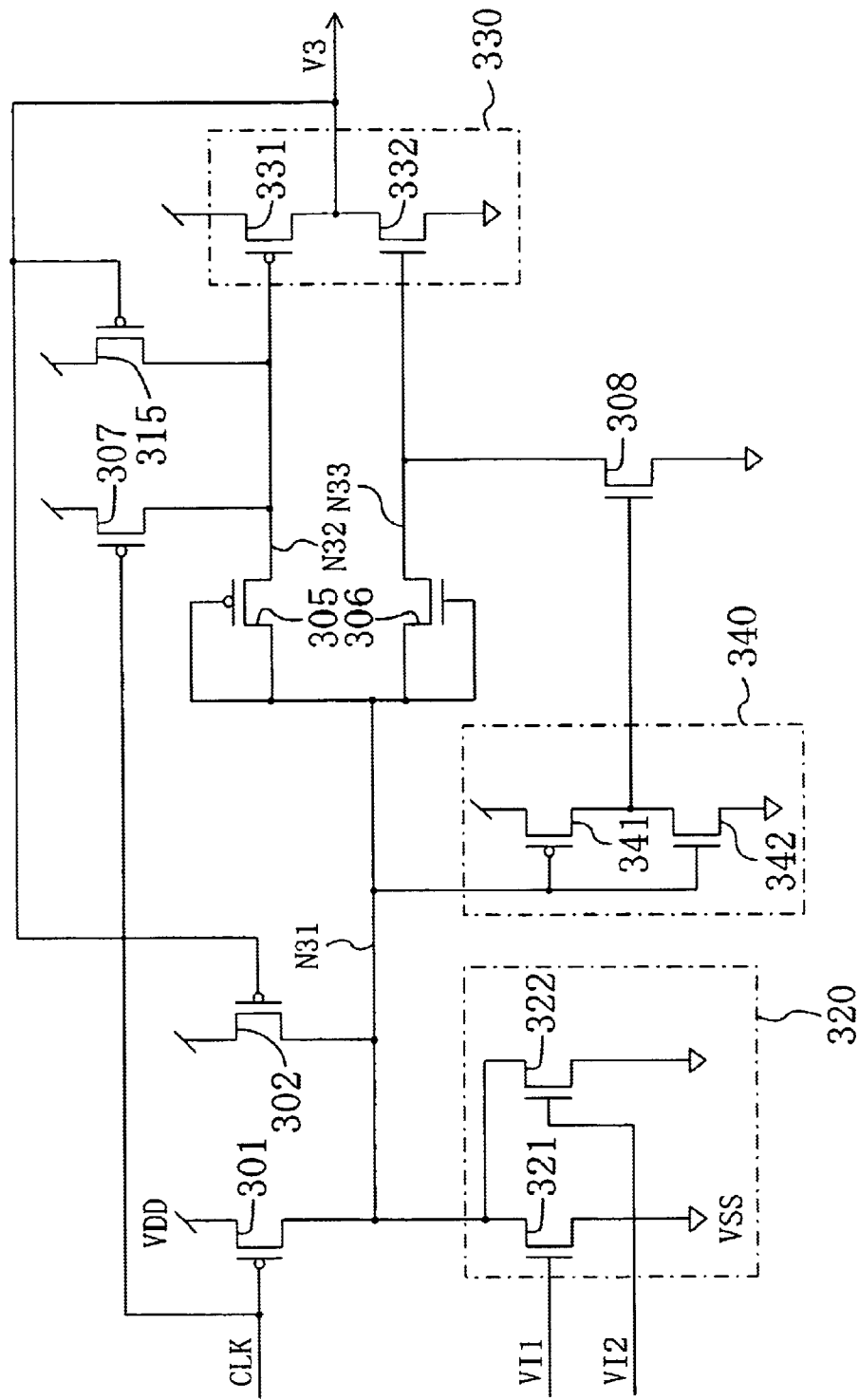
FIG. 3 is a circuit diagram of a semiconductor integrated circuit according to Embodiment 3 of the invention.

FIG. 3 is a circuit diagram of a semiconductor integrated circuit according to Embodiment 3 of the invention. The semiconductor integrated circuit of FIG. 3 can be obtained by additionally including NMOS transistors 306 and 308 and an inverter 340 in the semiconductor integrated circuit of FIG. 1. In FIG. 3, PMOS transistors 301, 302, 305, 307 and 331 are respectively similar to the PMOS transistors 101, 102, 105, 107 and 131 of FIG. 1. An input circuit 320 and an NMOS transistor 332 are respectively similar to the input circuit 120 and the NMOS transistor 132 of FIG. 1. Also, first and second nodes N31 and N32 respectively correspond to the nodes N11 and N12 of FIG. 1. The PMOS transistor 305 and the NMOS transistor 306 work as resistor devices.

The inverter 340 includes a PMOS transistor 341 and an NMOS transistor 342 and is similar to the inverter 240 of FIG. 2. The gate of the PMOS transistor 341 is connected to the node N31 and the drain thereof corresponds to an output node of the inverter 340.

The source of the NMOS transistor 308 is supplied with ground potential VSS and the gate thereof is supplied with an output signal of the inverter 340. The drain of the NMOS transistor 308 corresponds to a third node N33. The NMOS transistor 308 discharges the node N33 to potential in the vicinity of the ground potential VSS when the node N31 is at "L" level.

The gate and the drain of the NMOS transistor 306 are connected to the node N31 and the source thereof is connected to the drain of the NMOS transistor 308, namely, the node N33. When the node N31 has potential in the vicinity of supply potential VDD, the NMOS transistor 306 is turned on, so that the source and the drain thereof can be electrically connected to each other. Thus, the resistance between the source and the drain is reduced, and hence, the potential of the node N31 is transmitted to the node N33. At this point, the potential of the node N33 is lower than the potential of the node N31 approximately by a voltage Vtn3. The voltage Vtn3 corresponds to the threshold voltage of the NMOS transistor 306. When the node N31 has the potential in the vicinity of the ground potential VSS, the NMOS transistor 306 is turned off, so that the source and the drain thereof cannot be electrically connected. In other words, the resistance between the source and the drain is increased. In this manner, the NMOS transistor 306 works as a resistor device connected between the first node N31 and the third node N33.

Next, the operation of the semiconductor integrated circuit of FIG. 3 will be described mainly with respect to a difference from the operation of the semiconductor integrated circuit of FIG. 1. In the precharge period, the nodes N31 and N32 are precharged to the potential in the vicinity of the supply potential VDD similarly to the nodes N11 and N12 of FIG. 1. Therefore, the output signal of the inverter 340 changes in potential to "L" level, and the NMOS transistor 308 is turned off. If the potential of the node N33 is low, the NMOS transistor 306 is turned on, and hence, the node N33 is precharged to potential lower than that of the node N31 approximately by the voltage Vtn3.

In the case where both the input signals VI1 and VI2 are at "L" level in the evaluation period, the NMOS transistors 308, 321 and 322 and the PMOS transistors 301, 305 and 307 are in an off state. Although the subthreshold current flows between the source and the drain of each of these transistors, the nodes N31 and N32 keep their precharged state in substantially the same manner as in FIG. 1. Also the node N33 keeps the potential lower than that of the node N31 approximately by the voltage Vtn3.

In the case where both the input signals VI1 and VI2 undergo a "L" to "H" transition in the evaluation period, in the same manner as in FIG. 1, the node N31 is discharged to the potential in the vicinity of the ground potential VSS and the node N32 is discharged to potential higher than that of the node N31 approximately by the threshold voltage Vtp3 of the PMOS transistor 305. Since the node N31 changes in potential to "L" level, the NMOS transistor 306 is turned off. Also, the output of the inverter 340 undergoes a "L" to "H" transition, and the NMOS transistor 308 is turned on, and therefore, the node N33 is discharged to the potential in the vicinity of the ground potential VSS.

At this point, although the PMOS transistors 301, 302, 307 and 315 and the NMOS transistor 306 are in an off state, the subthreshold current flows between the source and the drain of each of these transistors. Therefore, the node N31 attains potential higher than the ground potential VSS. Since a current flows through the NMOS transistors 306 and 308, the potential of the node N33 becomes lower than the potential VN31 of the node N31 by VN31*r308/(r308+R306), wherein R306 is a resistance value between the source and the drain of the NMOS transistor 306 in an off state and r308 is a resistance value between the source and the drain of the NMOS transistor 308 in an on state.

Since the resistance value R306 of the NMOS transistor 306 in an off state can be easily made larger than the resistance value r308, the gate potential of the NMOS transistor 332 can be made closer to the ground potential VSS than that obtained when this gate is directly connected to the node N31. Accordingly, the subthreshold current of the NMOS transistor 332 can be reduced, and the resistance value between the source and the drain of this transistor can be increased, and therefore, the potential of an output signal V3 can be made closer to the supply potential VDD. In other words, in the circuit of FIG. 3, DC noise included in the output signal V3 can be reduced.

Also, in the case where at least one of the input signals VI1 and VI2 is at "H" level, even when the potential at "H" level of this input signal is lowered owing to superposed DC noise so as to increase the potential of the node N31, the potential of the node N33 can be made lower than the potential of the node N31. Therefore, the NMOS transistor 332 can be kept in an off state.

In this manner, according to the circuit of FIG. 3, in the case where the output signal V3 is at "H" level, the subthreshold current of the NMOS transistor 332 in an off state can be reduced, and therefore, DC noise superposed upon the output signal, namely, a shift of the output signal from a predetermined logic level, can be reduced. Also, even when an input signal includes DC noise, a signal with small DC noise can be output. Accordingly, it is possible to provide a semiconductor integrated circuit that is resistant to DC noise and in which a leakage current flowing in the output circuit is smaller than in a conventional dynamic circuit.

In this embodiment, the NMOS transistor 306 whose gate and drain are connected to the node N31 and whose source is connected to the node N33 is used as the resistor device. Similarly, any other device that has low resistance when the node N31 has the potential in the vicinity of the supply potential VDD, namely, the potential at "H" level, and has high resistance when the node N31 has the potential in the vicinity of the ground potential VSS, namely, the potential at "L" level, can be used instead of the NMOS transistor 306.

Also, the transistor connected to the node N32 may be similar to that used in FIG. 2. Specifically, in FIG. 3, the gate of the PMOS transistor 307 may be supplied with the output signal of the inverter 340 instead of the clock signal CLK with the PMOS transistor 315 omitted.

Embodiment 4

Figure 4:
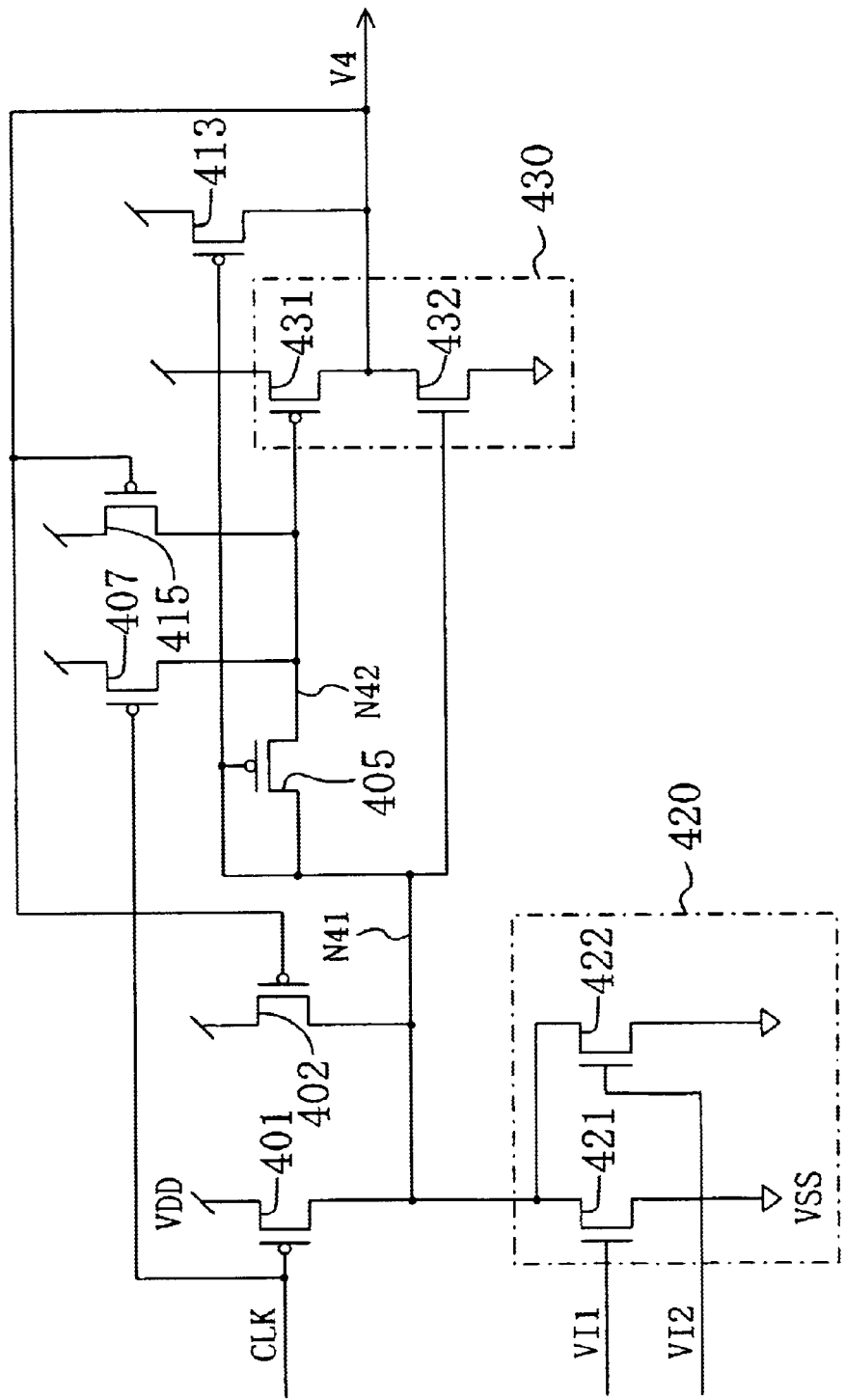
FIG. 4 is a circuit diagram of a semiconductor integrated circuit according to Embodiment 4 of the invention.

FIG. 4 is a circuit diagram of a semiconductor integrated circuit according to Embodiment 4 of the invention. The semiconductor integrated circuit of FIG. 4 can be obtained by additionally including a PMOS transistor 413 in the semiconductor integrated circuit of FIG. 1. In FIG. 4, PMOS transistors 401, 402, 405, 407, 415 and 431 are respectively similar to the PMOS transistors 101, 102, 105, 107, 115 and 131 of FIG. 1. An input circuit 420 and an NMOS transistor 432 are respectively similar to the input circuit 120 and the NMOS transistor 132 of FIG. 1. Also, first and second nodes N41 and N42 respectively correspond to the nodes N11 and N12 of FIG. 1. The PMOS transistor 405 works as a resistor device. The PMOS transistor 413 works as a third driving transistor.

The source of the PMOS transistor 413 is supplied with supply potential VDD, the drain thereof is connected to the drain of the PMOS transistor 431 corresponding to an output node of the circuit of FIG. 4, and the gate thereof is connected to the node N41. The PMOS transistor 413 drives an output signal V4 of the circuit of FIG. 4 to "H" level when the node N41 has potential in the vicinity of ground potential VSS (namely, potential at "L" level).

Next, the operation of the semiconductor integrated circuit of FIG. 4 performed when at least one of input signals VI1 and VI2 undergoes a "L" to "H" transition in the evaluation period will be described. In this case, in the same manner as in FIG. 1, the node N41 is discharged to the potential in the vicinity of the ground potential VSS and the node N42 is discharged to potential higher than that of the node N41 approximately by the threshold voltage Vtp4 of the PMOS transistor 405.

It takes time to discharge the node N42 by the PMOS transistor 405. Also, the gate potential of the PMOS transistor 413 is lowered to the potential in the vicinity of the ground potential VSS but the gate potential of the PMOS transistor 431 is lowered merely to the potential higher than this lowered gate potential of the PMOS transistor 413 approximately by the threshold voltage Vtp4 of the PMOS transistor 405. Therefore, when the node N41 is discharged to the potential in the vicinity of the ground potential VSS, the PMOS transistor 413 is first turned on, so as to drive the output node of the circuit of FIG. 4 to "H" level, and thereafter, the PMOS transistor 431 is turned on, so as to drive the output node to "H" level. In other words, when the circuit includes the PMOS transistor 413 as in FIG. 4, a "L" to "H" transition of the output signal V4 can be rapidly performed, so that delay time from the start of the evaluation period to the transition of the output signal can be reduced.

Furthermore, in the circuit of FIG. 4, similarly to the circuit of FIG. 1, the subthreshold current of the PMOS transistor 431 can be reduced. Moreover, since the PMOS transistors 413 and 431 are connected in parallel to each other, the sum of the driving power of these transistors can be equivalent to that of the driving transistor (such as the PMOS transistor 131 of FIG. 1) obtained without including the PMOS transistor 413. For example, the size of each of the PMOS transistors 413 and 431 can be a half of that of the PMOS transistor 131 of FIG. 1. Accordingly, the sum of leakage currents flowing through the PMOS transistors 413 and 431, that is, the driving transistors to drive the output node to "H" level, can be smaller than in a conventional circuit.

Embodiment 5

Figure 5:
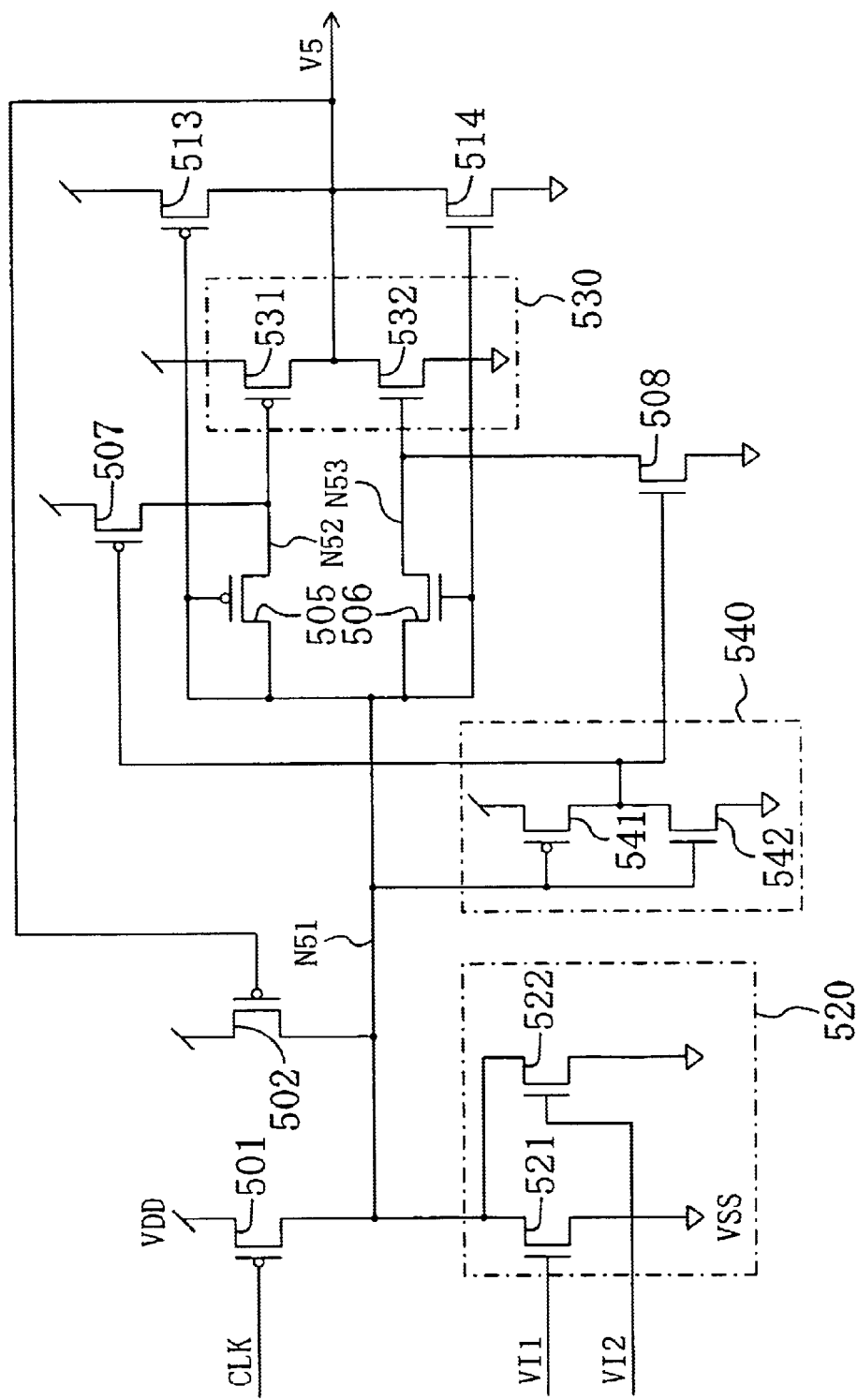
FIG. 5 is a circuit diagram of a semiconductor integrated circuit according to Embodiment 5 of the invention.

FIG. 5 is a circuit diagram of a semiconductor integrated circuit according to Embodiment 5 of the invention. The semiconductor integrated circuit of FIG. 5 can be obtained by additionally including a PMOS transistor 513 and an NMOS transistor 514 and omitting the PMOS transistor 315 in the semiconductor integrated circuit of FIG. 3. In FIG. 5, PMOS transistors 501, 502, 505, 507 and 531 are respectively similar to the PMOS transistors 301, 302, 305, 307 and 331 of FIG. 3. An input circuit 520, an inverter 540 and NMOS transistors 506, 508 and 532 are respectively similar to the input circuit 320, the inverter 340 and the NMOS transistor 306, 308 and 332 of FIG. 3. Also, first, second and third nodes N51, N52 and N53 respectively correspond to the nodes N31, N32 and N33 of FIG. 3. The PMOS transistor 505 and the NMOS transistor 506 work as resistor devices.

The gate of the PMOS transistor 507 is supplied not with a clock signal CLK but with an output signal of the inverter 540. The operation and the like of the PMOS transistor 513 are the same as those of the PMOS transistor 413 of FIG. 4 and hence the description is omitted.

The source of the NMOS transistor 514 is supplied with ground potential VSS, the drain thereof is connected to the drain of the PMOS transistor 531 corresponding to an output node of the circuit of FIG. 5 and the gate thereof is connected to the node N51. The NMOS transistor 514 drives an output signal V5 of the circuit of FIG. 5 to "L" level when the node N51 has potential in the vicinity of supply potential VDD (namely, the potential at "H" level).

Next, the operation of the semiconductor integrated circuit of FIG. 5 performed in the precharge period will be described. In this case, in the same manner as in FIG. 3, the node N51 is precharged to the potential in the vicinity of the supply potential VDD and the node N53 is precharged to potential lower than that of the node N51 approximately by the threshold voltage Vtn5 of the NMOS transistor 506.

It takes time to precharge the node N53 by the NMOS transistor 506. Also, the gate potential of the NMOS transistor 514 is increased to the potential in the vicinity of the supply potential VDD but the gate potential of the NMOS transistor 532 is increased merely to potential lower than this increased gate potential of the NMOS transistor 514 approximately by the threshold voltage Vtn5 of the NMOS transistor 506. Therefore, when the node N51 is precharged to the potential in the vicinity of the supply potential VDD, the NMOS transistor 514 is first turned on, so as to drive the output node of the circuit of FIG. 5 to "L" level, and thereafter, the NMOS transistor 532 is turned on, so as to drive the output node to "L" level. In other words, when the circuit includes the NMOS transistor 514 as in FIG. 5, a "H" to "L" transition of the output signal V5 can be rapidly performed.

Embodiment 6

Figure 6:
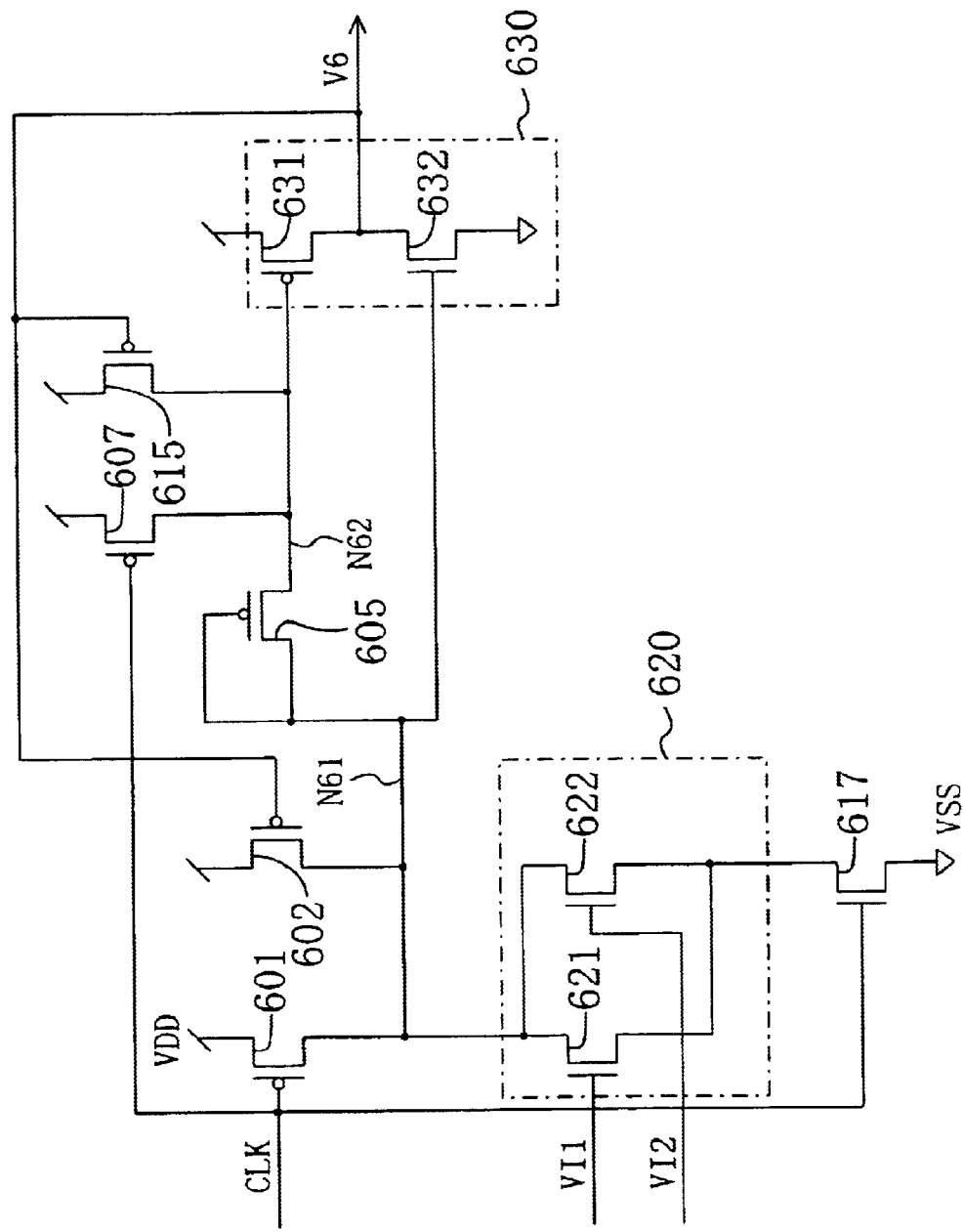
FIG. 6 is a circuit diagram of a semiconductor integrated circuit according to Embodiment 6 of the invention.

FIG. 6 is a circuit diagram of a semiconductor integrated circuit according to Embodiment 6 of the invention. The semiconductor integrated circuit of FIG. 6 can be obtained by additionally including an NMOS transistor 617 serially connected to the input circuit in the semiconductor integrated circuit of FIG. 1. In FIG. 6, PMOS transistors 601, 602, 605, 607, 615 and 631 are respectively similar to the PMOS transistors 101, 102, 105, 107, 115 and 131 of FIG.

1. An input circuit 620 and an NMOS transistor 632 are respectively similar to the input circuit 120 and the NMOS transistor 132 of FIG. 1. Also, first and second nodes N61 and N62 respectively correspond to the nodes N11 and N12 of FIG. 1. The PMOS transistor 605 works as a resistor device.

The drain of the NMOS transistor 617 is connected to the sources of the NMOS transistors 621 and 622. The source of the NMOS transistor 617 is supplied with ground potential VSS and the gate thereof is supplied with a clock signal CLK. The source and the drain of the NMOS transistor 617 are electrically connected to each other in a period when the clock signal CLK is at "H" level, namely, in the evaluation period, alone.

In each of the semiconductor integrated circuits shown in FIGS. 1 through 5, the input signals VI1 and VI2 need to satisfy the conditions that they are activated merely when the clock signal CLK is at "H" level and fixed to "L" level when the clock signal CLK is at "L" level. In the semiconductor integrated circuit of FIG. 6, however, owing to the additionally included NMOS transistor 617, the node N61 can be discharged merely in the period when the clock signal CLK is at "IT" level. Accordingly, there is no need for the input signals VI1 and VI2 to satisfy the condition that they are fixed to "L" level when the clock signal CLK is at "L" level. Thus, the conditions to be satisfied by the input signals VI1 and VI2 can be reduced.

Embodiment 7

Figure 7:
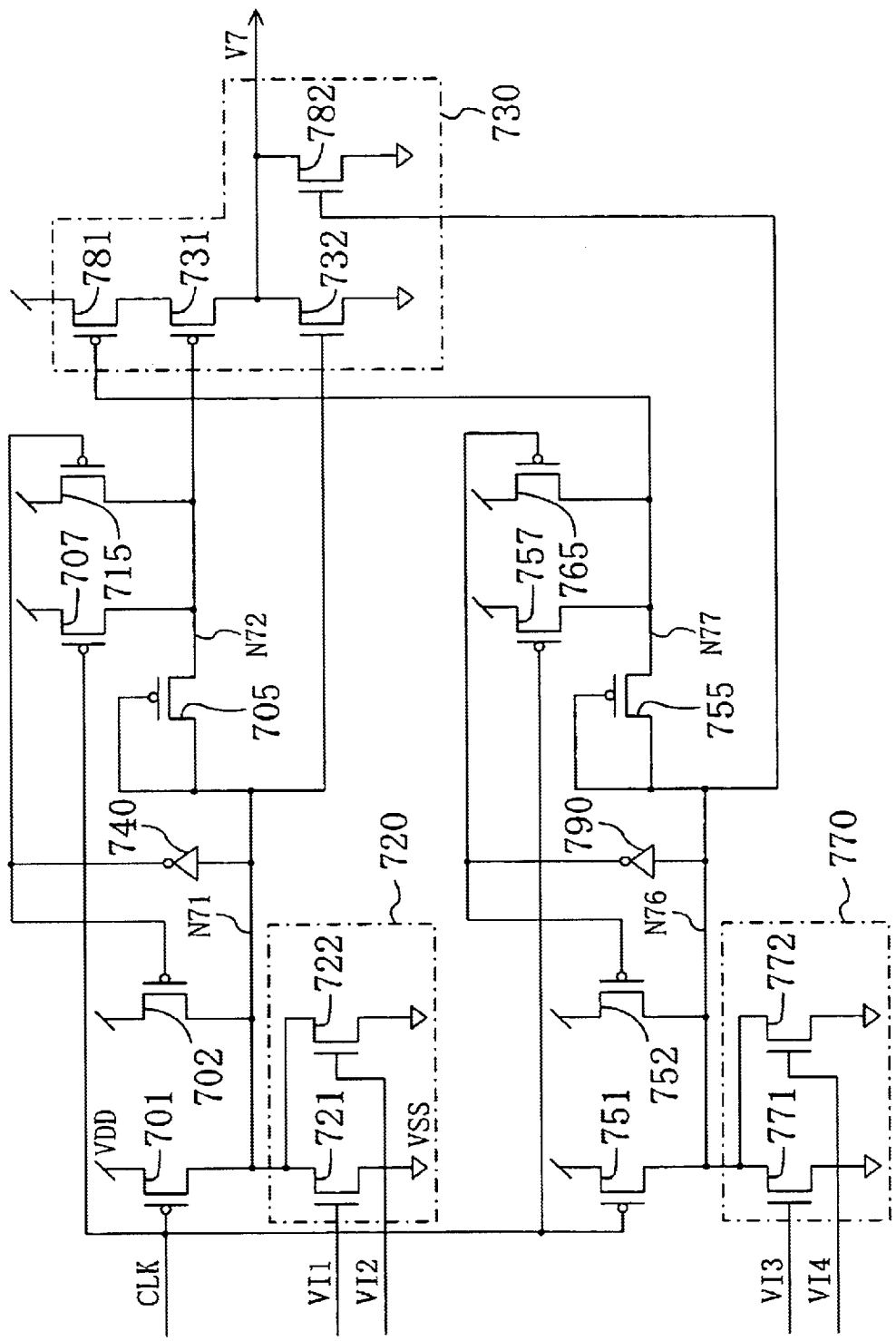
FIG. 7 is a circuit diagram of a semiconductor integrated circuit according to Embodiment 7 of the invention.

FIG. 7 is a circuit diagram of a semiconductor integrated circuit according to Embodiment 7 of the invention. The semiconductor integrated circuit of FIG. 7 includes two circuits (respectively designated as first and second dynamic circuits), each of which is obtained by additionally including an inverter 740 and omitting the output circuit 130 in the semiconductor integrated circuit of FIG. 1, and an output circuit 730.

In FIG. 7, PMOS transistors 701, 702, 705, 707 and 715 are respectively similar to the PMOS transistors 101, 102, 105, 107 and 115 of FIG. 1. An input circuit 720 is similar to the input circuit 120 of FIG. 1. First and second nodes N71 and N72 respectively correspond to the nodes N11 and N12 of FIG. 1.

Also, PMOS transistors 751, 752, 755, 757 and 765, an input circuit 770 and an inverter 790 are respectively similar to the PMOS transistors 701, 702, 705, 707 and 715, the input circuit 720 and the inverter 740. Third and fourth nodes N76 and N77 respectively correspond to the nodes N11 and N12 of FIG. 1. The PMOS transistors 705 and 755 work as resistor devices.

The input nodes of the inverters 740 and 790 are respectively connected to the nodes N71 and N76. Differently from the circuit of FIG. 1, the gates of the PMOS transistors 702 and 715 are supplied with an output signal of the inverter 740. The gates of the PMOS transistors 752 and 765 are supplied with an output signal of the inverter 790.

When the node N71 is at "H" level, the output signal of the inverter 740 is at "L" level, and therefore, the PMOS transistor 702 is in an on state. In other words, the PMOS transistor 702 works so as to keep the "H" logic level of the node N71 at this point. Similarly, when the node N76 is at "H" level, the PMOS transistor 752 works to keep the logic level of the node N76.

The input circuit 720 includes NMOS transistors 721 and 722, and the input circuit 770 includes NMOS transistors 771 and 772. The gates of the NMOS transistors 721 and 722 are respectively supplied with input signals VI1 and VI2, and the gates of the NMOS transistors 771 and 772 are respectively supplied with input signals VI3 and VI4.

The output circuit 730 includes PMOS transistors 731 and 781 and NMOS transistors 732 and 782. The nodes N71 and N72 corresponding to the output nodes of the first dynamic circuit are respectively connected to the gates of the NMOS transistor 732 and the PMOS transistor 731. The nodes N76 and N77 corresponding to the output nodes of the second dynamic circuit are respectively connected to the gates of the NMOS transistor 782 and the PMOS transistor 781. The source of the PMOS transistor 781 is connected to the power supply and the drain thereof is connected to the source of the PMOS transistor 731. The drain of the PMOS transistor 731 is connected to the drains of the NMOS transistors 732 and 782. The sources of the NMOS transistors 732 and 782 are grounded. The drain of the PMOS transistor 731 corresponds to an output node of the semiconductor integrated circuit of FIG. 7. Thus, the PMOS transistors 731 and 781 and the NMOS transistors 732 and 782 together construct one logic circuit.

Since the nodes N71 and N72 are equal in the logic level and the nodes N76 and N77 are equal in the logic level, it can be said that the output circuit 730 obtains and outputs a result of the NOR operation between the output of the first dynamic circuit and the output of the second dynamic circuit. The first dynamic circuit outputs a result of the NOR operation between the input signals VI1 and VI2, and the second dynamic circuit outputs a result of the NOR operation between the input signals VI3 and VI4. Specifically, assuming that the input signals VI1, VI2, VI3 and VI4 respectively have logic values A, B, C and D, the semiconductor integrated circuit of FIG. 7 obtains and outputs (A NOR B) NOR (C NOR D)=(A OR B) AND (C OR D).

The operations of the first and second dynamic circuits are the same as the operation of the semiconductor integrated circuit of FIG. 1. Specifically, when the node N71 is at "H" level, the gate potential of the PMOS transistor 731 can be higher than the potential of the node N71. Also, when the node N76 is at "H" level, the gate potential of the PMOS transistor 781 can be higher than the potential of the node N76. Accordingly, in outputting an output signal V7 at "L" level, an output signal V7 can be closer to ground potential VSS than in the case where the PMOS transistor 705 or 755 is not included.

In this manner, in the circuit of FIG. 7, when the output signal V7 is at "L" level, the subthreshold currents of the PMOS transistors 731 and 781 in an off state can be reduced, and therefore, DC noise superposed upon the output signal, namely, a shift of the output signal from a predetermined logic level, can be reduced. Accordingly, also when an output circuit complicated as shown in FIG. 7 is included, it is possible to provide a semiconductor integrated circuit that is resistant to DC noise and in which a leakage current flowing in the output circuit is smaller.

Although the output circuit 730 is a NOR circuit in this embodiment, the output circuit may be another logic circuit such as a NAND circuit or a circuit obtained by combining a plurality of logic circuits.

Embodiment 8

Figure 8:
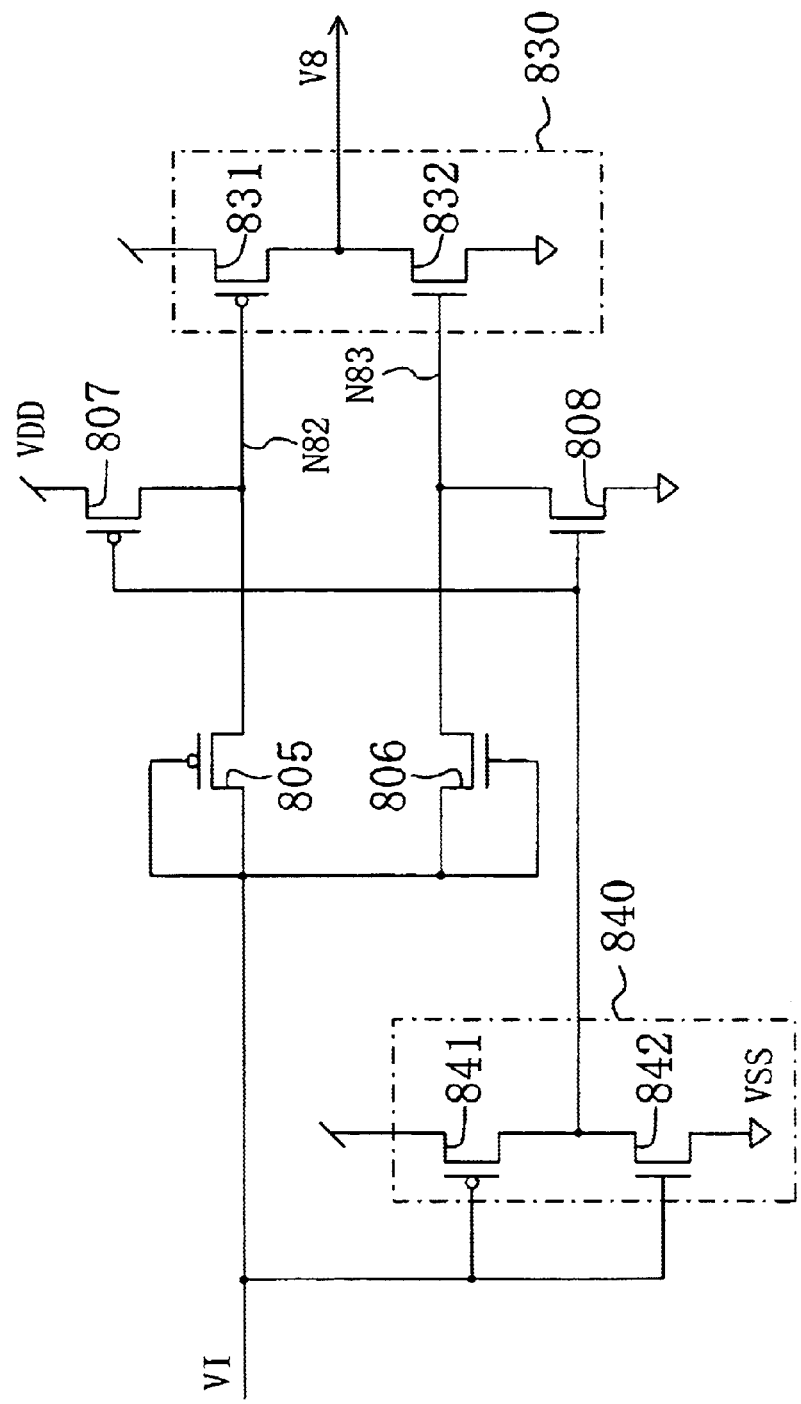
FIG. 8 is a circuit diagram of a semiconductor integrated circuit according to Embodiment 8 of the invention.

FIG. 8 is a circuit diagram of a semiconductor integrated circuit according to Embodiment 8 of the invention. The semiconductor integrated circuit of FIG. 8 can be obtained by omitting the PMOS transistors 301, 302 and 315 and the input circuit 320 in the semiconductor integrated circuit of FIG. 3. This circuit is a static circuit not using a clock signal, and works as an inverter for outputting a signal obtained by inverting the logic level of an input signal VI.

More specifically, the semiconductor integrated circuit of FIG. 8 includes PMOS transistors 805 and 807, NMOS transistors 806 and 808, an output circuit 830 and an inverter 840. The output circuit 830 includes a PMOS transistor 831 and an NMOS transistor 832, and the inverter 840 includes a PMOS transistor 841 and an NMOS transistor 842.

The PMOS transistors 805, 807, 831 and 841 of FIG. 8 are respectively similar to the PMOS transistors 305, 307, 331 and 341 of FIG. 3. The NMOS transistors 806, 808, 832 and 842 are respectively similar to the NMOS transistors 306, 308, 332 and 342 of FIG. 3. In FIG. 8, the gate and the drain of the PMOS transistor 805 correspond to an input node to which the input signal VI is directly input. First and second nodes N82 and N83 respectively correspond to the nodes N32 and N33 of FIG. 3. The PMOS transistor 805 and the NMOS transistor 806 work as resistor devices. The PMOS transistor 807 and the NMOS transistor 808 respectively work as first and second transistors. The PMOS transistor 831 and the NMOS transistor 832 respectively work as first and second driving transistors.

Next, the operation of the semiconductor integrated circuit of FIG. 8 will be described. In the case where the input signal VI is at "L" level, the input node has potential in the vicinity of ground potential VSS. Therefore, the PMOS transistor 805 is turned on, and charge of the node N82 flows to the input node, and hence, the node N82 attains potential higher than the potential of the input node approximately by the threshold voltage Vtp8 of the PMOS transistor 805. On the other hand, the NMOS transistor 806 is turned off. Furthermore, the output node of the inverter 840 changes in potential to "H" level, and hence, the PMOS transistor 807 is turned off and the NMOS transistor 808 is turned on. Therefore, the node N83 is discharged by the NMOS transistor 808 so as to attain the potential in the vicinity of the ground potential VSS.

Since the nodes N82 and N83 are both at "L" logic level, the PMOS transistor 831 is turned on and the NMOS transistor 832 is turned off, and hence, an output signal VS is at "H" level. The gate potential of the PMOS transistor 831 is higher than the potential of the input node approximately by the threshold voltage Vtp8 of the PMOS transistor 805, and the driving power of the PMOS transistor 831 becomes smaller than when the gate potential is at the level in the vicinity of the ground potential VSS.

At this point, it is assumed that the input node is grounded via an NMOS transistor circuit (not shown) and is connected to the power supply via a PMOS transistor circuit (not shown). When the input signal VI is at "L" level, this NMOS transistor circuit is in an on state and this PMOS transistor circuit is in an off state. When the NMOS transistor circuit disposed between the input node of the circuit of FIG. 8 and the ground line has a resistance value rn8 and the PMOS transistor circuit disposed between the input node and the power supply has a resistance value Rp8 and the ground potential VSS is 0, the potential VINL of the input node is VDD*rn8/(Rp8+rn8).

At this point, a current flows from the input node to the ground line through the NMOS transistors 806 and 808. By using a resistance value R806 between the source and the drain of the NMOS transistor 806 in an off state and a resistance value r808 between the source and the drain of the NMOS transistor 808 in an on state, the potential of the node N83 is expressed as VINL*(r808/(R806+r808)). This potential is lower than the potential VINL of the input node by (VINL*(R806/(R806+r808)).

Since the resistance value R806 can be made larger than the resistance value r808, the gate potential of the NMOS transistor 832 can be made closer to the ground potential VSS than that obtained when the gate of this transistor is directly connected to the input node. Therefore, the subthreshold current of the NMOS transistor 832 can be reduced. Accordingly, the resistance between the source and the drain of the NMOS transistor 832 is increased, and hence, the potential of the output signal V8 can be made closer to the supply potential VDD. In other words, an output with smaller DC noise can be realized.

Next, the operation performed when the input signal VI is at "H" level will be described. The input node has the potential in the vicinity of the supply potential VDD. The NMOS transistor 806 is turned on and charge flows from the input node to the node N83, and hence, the node N83 attains potential lower than the potential of the input node approximately by the threshold voltage Vtn8 of the NMOS transistor 806. On the other hand, the PMOS transistor 805 is turned off. Also, since the output node of the inverter 840 changes in potential to "L" level, the PMOS transistor 807 is turned on and the NMOS transistor 808 is turned on. Therefore, the node N82 is charged by the PMOS transistor 807 to attain the potential in the vicinity of the supply potential VDD.

Since the nodes N82 and N83 are both at "H" logic level, the PMOS transistor 831 is turned off and the NMOS transistor 832 is turned on, and hence, the output signal V8 is at "L" level. Since the gate potential of the NMOS transistor 832 is lower than the potential of the input node approximately by the threshold voltage Vtn8 of the NMOS transistor 806, its driving power becomes smaller than when the gate potential is at the level in the vicinity of the supply potential VDD.

Similarly to the case where the input signal VI is at "L" level, it is assumed that the input node is grounded via an NMOS transistor circuit and is connected to the power supply via a PMOS transistor circuit. When the input signal VI is at "H" level, this NMOS transistor circuit is in an off state and this PMOS transistor circuit is in an on state. When the NMOS transistor circuit disposed between the input node of the circuit of FIG. 8 and the ground line has a resistance value Rn8 and the PMOS transistor circuit disposed between the input node and the power supply has a resistance value rp8 and the ground potential VSS is 0, the potential VINH of the input node is VDD*Rn8/(rp8+Rn8).

At this point, a current flows from the power supply through the PMOS transistors 807 and 805 to the input node. When a resistance value R805 between the source and the drain of the PMOS transistor 805 in an off state and a resistance value r807 between the source and the drain of the PMOS transistor 807 in an on state are used, the potential of the node N82 is higher than the potential VINH of the input node by (VDD−VINH)*(R805/(R805+r807)).

Since the resistance value R805 can be made larger than the resistance value r807, the gate potential of the PMOS transistor 831 can be closer to the supply potential VDD than that obtained when the gate of this transistor is directly connected to the input node. Therefore, the subthreshold current of the PMOS transistor 831 can be reduced. Accordingly, the resistance between the source and the drain of the PMOS transistor 831 is increased, and hence, the potential of the output signal V8 can be closer to the ground potential VSS. In other words, an output with smaller DC noise can be realized.

Also, even if the potential of the input signal VI is lowered due to superposed DC noise when the input signal VI is at "H" level, the potential of the node N82 can be made higher than the potential of the input node, and hence, the PMOS transistor 831 can be kept in an off state. Alternatively, even if the potential of the input signal VI is increased due to superposed DC noise when the input signal VI is at "L" level, the potential of the node N83 can be made lower than the potential of the input node, and hence, the NMOS transistor 832 can be kept in an off state.

In this manner, in the circuit of FIG. 8, the subthreshold current of the PMOS transistor 831 that is in an off state when the output signal V8 is at "L" level and the subthreshold current of the NMOS transistor 832 that is in an off state when the output signal V8 is at "H" level can be reduced. Therefore, DC noise superposed upon the output signal, namely, a shift of the output signal from a predetermined logic level, can be reduced. Also in the case where an input signal includes DC noise, a signal with small DC noise can be output. Accordingly, it is possible to provide a semiconductor integrated circuit that is resistant to DC noise and in which a leakage current in the output circuit is smaller than in the conventional dynamic circuit.

It is noted that the gate of the NMOS transistor 832 may be connected to the input node with the NMOS transistors 806 and 808 omitted in FIG. 8. In this case, the subthreshold current of the PMOS transistor 831 can be reduced.

Alternatively, the gate of the PMOS transistor 831 may be connected to the input node with the PMOS transistors 805 and 807 omitted in FIG. 8. In this case, the subthreshold current of the NMOS transistor 832 can be reduced.

The PMOS transistor 805 whose gate and drain are connected to the input node and whose source is connected to the node N82 is used as the resistor device in this embodiment. Similarly, any other device that has high resistance when the input node has the potential in the vicinity of the supply potential VDD, namely, the potential at "H" level, and has low resistance when the input node has the potential in the vicinity of the ground potential VSS, namely, the potential at "L" level, can be used instead of the PMOS transistor 805.

Also, the NMOS transistor 806 whose gate and drain are connected to the input node and whose source is connected to the node N83 is used as the resistor device in this embodiment. Similarly, any other device that has low resistance when the input node has the potential in the vicinity of the supply potential VDD, namely, the potential at "H" level, and has high resistance when the input node has the potential in the vicinity of the ground potential VSS, namely, the potential at "L" level, can be used instead of the NMOS transistor 806.

Embodiment 9

In the semiconductor integrated circuit of FIG. 8, the node N82 is discharged for outputting the output signal at "H" level, but since the node N82 is discharged through the PMOS transistor 805, delay time is larger than in a conventional circuit. Also, since the gate potential of the PMOS transistor 831 is lowered merely to the potential higher than the ground potential VSS by approximately the threshold voltage Vtp8 of the PMOS transistor 805, the driving power of the PMOS transistor 831 is smaller than in the case where the gate potential is lowered to potential in the vicinity of the ground potential VSS.

Similarly in the semiconductor integrated circuit of FIG. 8, the node N83 is charged for outputting the output signal at "L" level, but since the node N83 is charged through the NMOS transistor 806, delay time is larger than in the conventional circuit. Also, since the gate potential of the NMOS transistor 832 is increased merely to the potential lower than the supply potential VDD by approximately the threshold voltage Vtn8 of the NMOS transistor 806, the driving power of the NMOS transistor 832 is smaller than in the case where the gate potential is increased to potential in the vicinity of the supply potential VDD.

Figure 9:
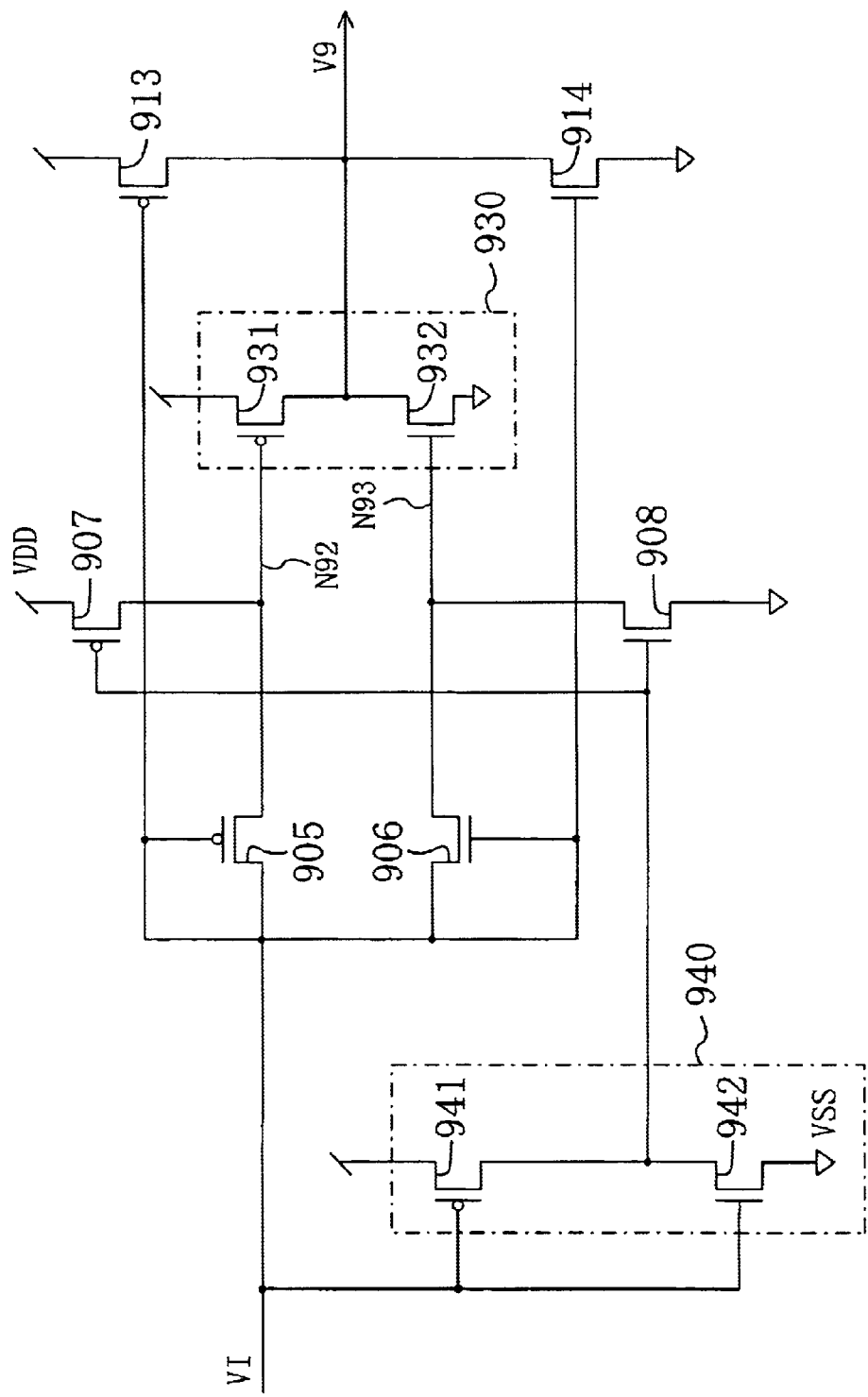
FIG. 9 is a circuit diagram of a semiconductor integrated circuit according to Embodiment 9 of the invention.

In this embodiment, a semiconductor integrated circuit improved in these points will be described. FIG. 9 is a circuit diagram of the semiconductor integrated circuit according to Embodiment 9 of the invention. The semiconductor integrated circuit of FIG. 9 can be obtained by additionally including a PMOS transistor 913 and an NMOS transistor 914 in the semiconductor integrated circuit of FIG. 8.

In FIG. 9, PMOS transistors 905, 907 and 931 are respectively similar to the PMOS transistors 805, 807 and 831 of FIG. 8. NMOS transistors 906, 908 and 932 and an inverter 940 are respectively similar to the NMOS transistors 806, 808 and 832 and the inverter 840 of FIG. 8. Also, first and second nodes N92 and N93 respectively correspond to the nodes N82 and N83 of FIG. 8. The PMOS transistor 905 and the NMOS transistor 906 work as resistor devices.

The source of the PMOS transistor 913 is supplied with supply voltage VDD, the drain thereof is connected to the drain of the PMOS transistor 931 corresponding to the output node of the circuit of FIG. 9 and the gate thereof is connected to an input node. The PMOS transistor 913 drives an output signal V9 of the circuit of FIG. 9 to "H" level when the input node has potential in the vicinity of ground potential VSS (namely, potential at "L" level).

The source of the NMOS transistor 914 is supplied with the ground potential VSS, the drain thereof is connected to the drain of the PMOS transistor 931 corresponding to the output node of the circuit of FIG. 9 and the gate thereof is connected to the input node. The NMOS transistor 914 drives the output signal V9 of the circuit of FIG. 9 to "L" level when the input node has potential in the vicinity of the supply potential VDD (namely, potential at "L" level).

Next, the operation of the semiconductor integrated circuit of FIG. 9 will be described. In the case where an input signal VI is at "L" level, the input node has the potential in the vicinity of the ground potential VSS. In the same manner as in FIG. 8, the node N92 is discharged to potential higher than the potential of the input node approximately by the threshold voltage Vtp9 of the PMOS transistor 905.

It takes time to discharge the node N92 by the PMOS transistor 905. Also, the gate potential of the PMOS transistor 913 is lowered to the potential in the vicinity of the ground potential VSS but the gate potential of the PMOS transistor 931 is lowered merely to the potential higher than this lowered gate potential of the PMOS transistor 913 by approximately the threshold voltage Vtp9 of the PMOS transistor 905. Therefore, when the input node is discharged to the potential in the vicinity of the ground potential VSS, the PMOS transistor 913 is first turned on, so as to drive the output node of the circuit of FIG. 9 to "H" level, and thereafter, the PMOS transistor 931 is turned on, so as to drive the output node to "H" level. In other words, when the circuit includes the PMOS transistor 913 as in FIG. 9, a "L" to "H" transition of the output signal V9 is rapidly performed, so that the delay time from the start of the evaluation period to the transition of the output signal can be reduced.

In the case where the input signal VI is at "H" level, the input node has potential in the vicinity of the supply potential VDD. The node N93 is charged to potential lower than the potential of the input node approximately by the threshold voltage Vtn9 of the NMOS transistor 906.

It takes time to charge the node N93 by the NMOS transistor 906. Also, the gate potential of the NMOS transistor 914 is increased to the potential in the vicinity of the supply voltage VDD but the gate potential of the NMOS transistor 932 is increased merely to potential lower than this increased gate potential of the NMOS transistor 914 approximately by the threshold voltage Vtn9 of the NMOS transistor 906. Therefore, when the input node is charged to the potential in the vicinity of the supply potential VDD, the NMOS transistor 914 is first turned on, so as to drive the output node of the circuit of FIG. 9 to "L" level, and thereafter, the NMOS transistor 932 is turned on, so as to drive the output node to "L" level. In other words, when the circuit includes the NMOS transistor 914 as in FIG. 9, a "H" to "L" transition of the output signal V9 is rapidly performed, so that the delay time from the start of the evaluation period to the transition of the output signal can be reduced.

It is noted that the output signal V9 may be supplied to the gates of the PMOS transistor 907 and the NMOS transistor 908 with the inverter 940 omitted.

Embodiment 10

Figure 10:
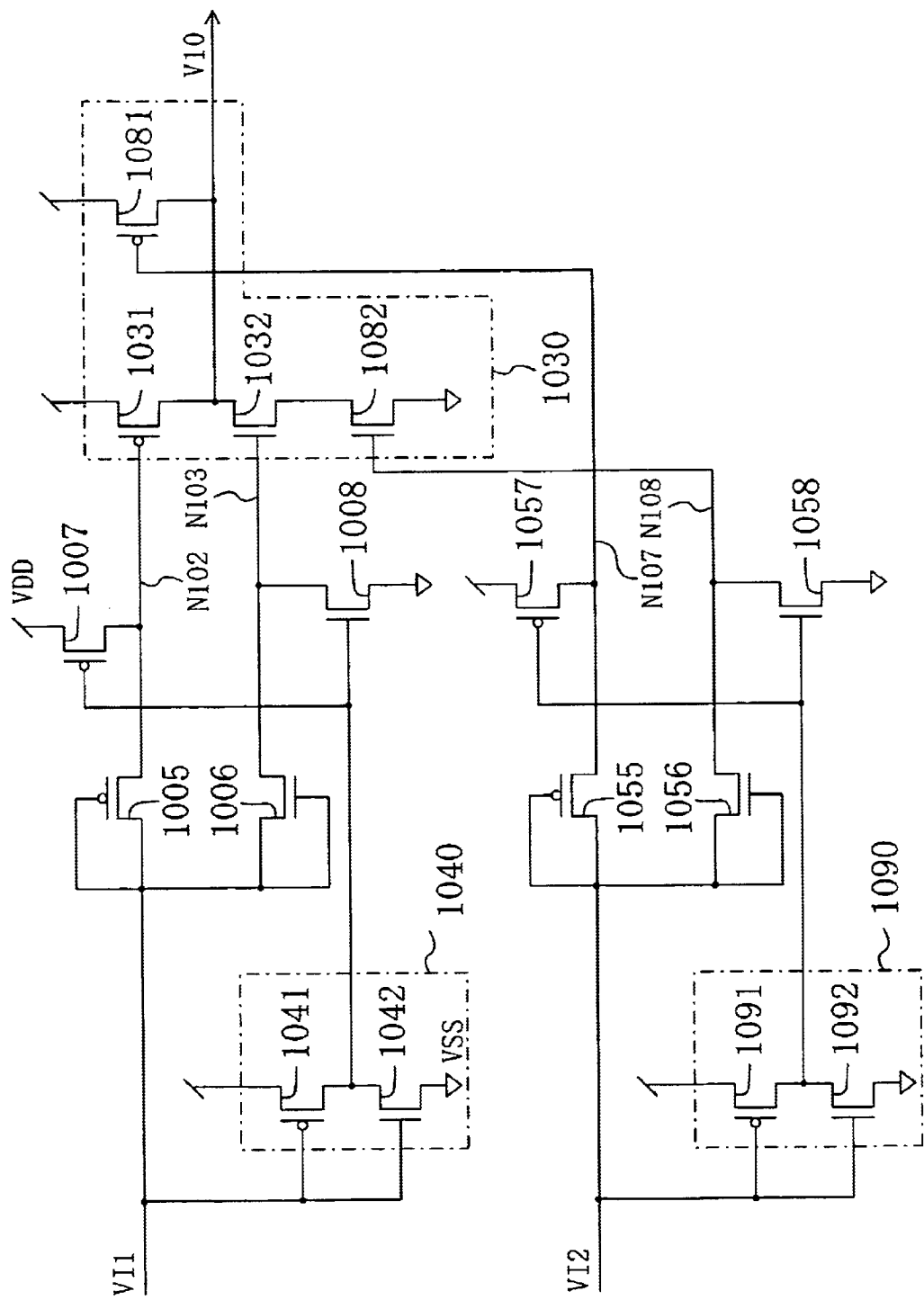
FIG. 10 is a circuit diagram of a semiconductor integrated circuit according to Embodiment 10 of the invention.
Figure 11:
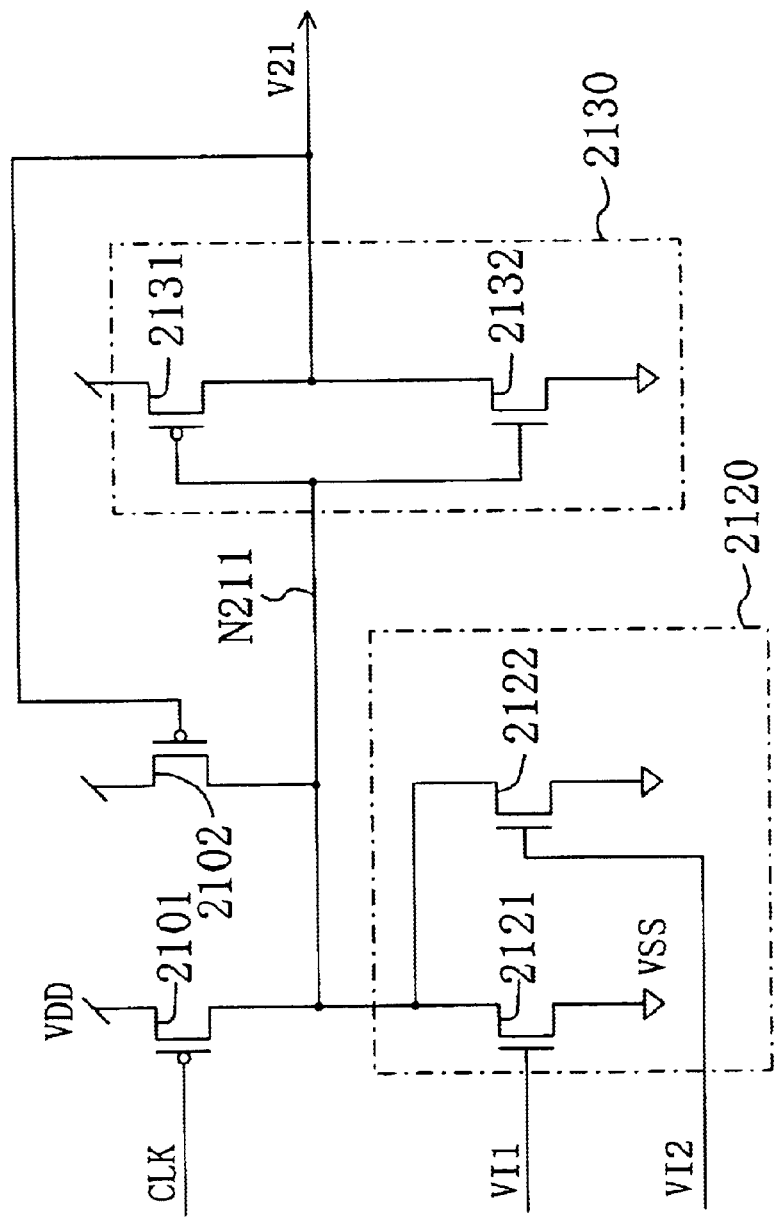
FIG. 11 is a circuit diagram of a conventional dynamic semiconductor integrated circuit.
Figure 12:
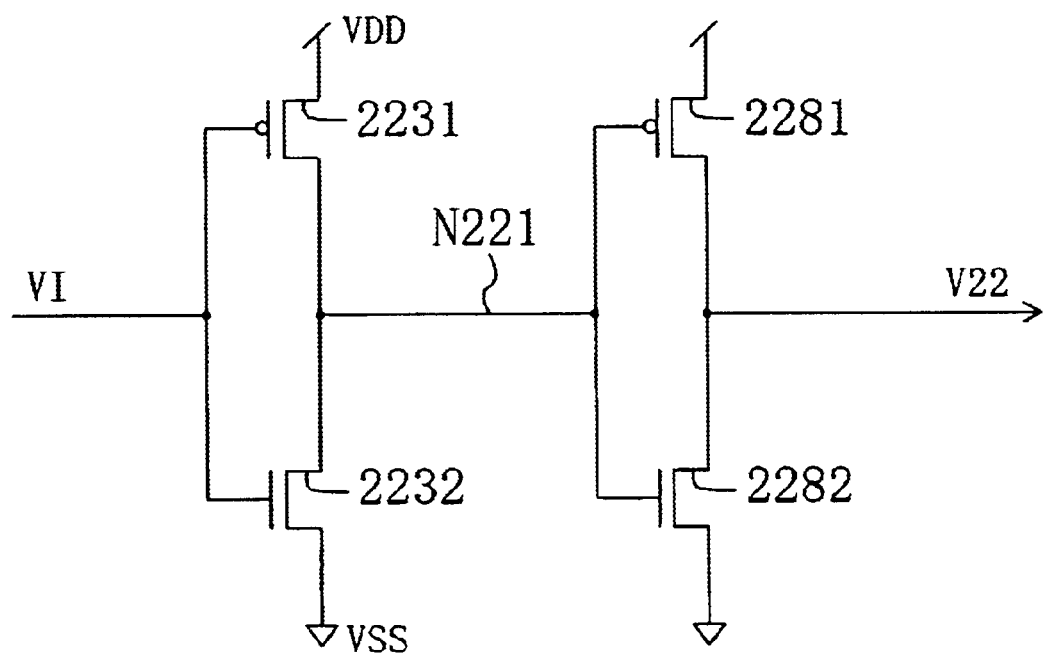
FIG. 12 is a circuit diagram of a conventional static semiconductor integrated circuit.

FIG. 10 is a circuit diagram of a semiconductor integrated circuit according to Embodiment 10 of the invention. The semiconductor integrated circuit of FIG. 10 includes two circuits (respectively designated as first and second static circuits), each of which is obtained by omitting the output circuit 830 in the semiconductor integrated circuit of FIG. 8, and an output circuit 1030.

In FIG. 10, PMOS transistors 1005, 1007 and 1031 are respectively similar to the PMOS transistors 805, 807 and 831 of FIG. 8. NMOS transistors 1006, 1008 and 1032 are respectively similar to the NMOS transistors 806, 808 and 832 of FIG. 8. First and second nodes N102 and N103 respectively correspond to the nodes N82 and N83 of FIG. 8. Third and fourth nodes N017 and N108 respectively correspond to the nodes N82 and N83 of FIG. 8.

Also, PMOS transistors 1055, 1057 and 1081 and an inverter 1040 are respectively similar to the PMOS transistors 805, 807 and 831 and the inverter 840 of FIG. 8. NMOS transistors 1056, 1058 and 1082 are respectively similar to the NMOS transistors 806, 808 and 832 of FIG. 8. The PMOS transistors 1005, 1006, 1055 and 1056 work as resistor devices.

The output circuit 1030 includes PMOS transistors 1031 and 1081 and NMOS transistors 1032 and 1082. The nodes N102 and N103 corresponding to the output nodes of the first static circuit are respectively connected to the gates of the PMOS transistor 1031 and the NMOS transistor 1032. The nodes N107 and N108 corresponding to the output nodes of the second static circuit are respectively connected to the gates of the PMOS transistor 1081 and the NMOS transistor 1082. The sources of the PMOS transistors 1031 and 1081 are connected to the power supply and the drains thereof are connected to the drain of the NMOS transistor 1032. The source of the NMOS transistor 1032 is connected to the drain of the NMOS transistor 1082. The source of the NMOS transistor 1082 is grounded. The drains of the PMOS transistors 1031 and 1081 correspond to the output node of the semiconductor integrated circuit of FIG. 10. In this manner, the PMOS transistors 1031 and 1081 and the NMOS transistors 1032 and 1082 together construct one logic circuit.

Input signals VI1 and VI2 are respectively input to the first and second static circuits. Since the nodes N102 and N103 are equal in the logic level and the nodes N107 and N108 are equal in the logic level, it can be said that the output circuit 1030 outputs a result of the NAND operation between the output of the first static circuit and the output of the second static circuit. Since each of the first and second static circuits outputs a signal at the same logic level as an input signal, the semiconductor integrated circuit of FIG. 10 outputs a result of the NAND operation between the input signals VI1 and VI2.

The operations of the first and second static circuits are the same as that of the semiconductor integrated circuit of FIG. 8. Specifically, when the input signal VI1 is at "H" level, the gate potential of the PMOS transistor 1031 can be made higher than the potential of the input signal VI1 and close to the supply potential VDD. Also, when the input signal VI2 is at "H" level, the gate potential of the PMOS transistor 1081 can be made higher than the potential of the input signal VI2. Therefore, in outputting an output signal V10 at "L" level, the output signal V10 can be closer to the ground potential VSS than in the case where the PMOS transistor 1005 or 1055 is not included.

Similarly, when the input signal VI1 is at "L" level, the gate potential of the NMOS transistor 1032 can be made lower than the potential of the input signal VI1 and close to the ground potential VDD. Also, when the input signal VI2 is at "L" level, the gate potential of the NMOS transistor 1082 can be made lower than the potential of the input signal VI2. Therefore, in outputting the output signal V10 at "H" level, the output signal V10 can be closer to the supply potential VDD than in the case where the NMOS transistor 1006 or 1056 is not included.

In this manner, in the circuit of FIG. 10, when the output signal V10 is at "L" level, the subthreshold currents of the PMOS transistors 1031 and 1081 in an off state can be reduced, and therefore, DC noise superposed upon the output signal, namely, a shift of the output signal from a predetermined logic level, can be reduced. Accordingly, also when an output circuit complicated as shown in FIG. 10 is included, it is possible to provide a semiconductor integrated circuit that is resistant to DC noise and in which a leakage current flowing in the output circuit is smaller.

Although the output circuit 1030 is a NAND circuit in this embodiment, the output circuit may be another logic circuit such as a NOR circuit or a circuit obtained by combining a plurality of logic circuits.

In each of the above-described embodiments, the conductivity types and the logic levels of all the transistors and signals may be reversed. Specifically, in each of FIGS. 1 through 10, all the PMOS transistors may be replaced with NMOS transistors, with all the NMOS transistors replaced with PMOS transistors, with the supply potential VDD and the ground potential VSS mutually replaced and with the logic levels of all the signals reversed. In this case, the low logic level corresponds to the first logic level and the high logic level corresponds to the second logic level.

Also, instead of the MOS transistors, devices such as transistors other than the MOS transistors may be used.

Although the PMOS transistor is used as the first resistor device and the NMOS transistor is used as the second resistor device in the embodiments, the resistor devices are not limited to these transistors. Specifically, any other device that has low resistance between its two terminals when a potential difference between the two terminals is large and has high resistance when the potential difference is small may be used as the resistor device.

In each of embodiments 1 through 7, although the input circuit includes the two NMOS transistors connected in parallel to each other and the potential of the first node is changed in accordance with the OR between the two input signals VI1 and VI2, the input circuit may have another configuration for realizing another logical operation. Specifically, the number of input signals may be larger than two, and the potential of the first node may be changed in accordance with the AND between a plurality of input signals or the OR between different ANDs.

As described so far, the present invention provides a semiconductor integrated circuit for outputting a signal with small DC noise even when an input signal includes DC noise. Accordingly, even when a plurality of such circuits are serially connected to one another, the DC noise can be prevented from being amplified to increase, resulting in preventing malfunction of the circuit.

Also, since a leakage current in the output circuit can be suppressed in a dynamic circuit even while an input clock signal is being halted, the power consumption of the whole circuit during standby can be suppressed.

What is claimed is:

1. A semiconductor integrated circuit comprising:
    a first transistor for setting a first node at a first logic level in accordance with a clock signal;
    an input circuit for setting said first node at a second logic level different from said first logic level in accordance with an input signal;
    a second transistor for setting a second node at said first logic level when said first node is at said first logic level;
    a first resistor device that is connected between said first node and said second node and has a large resistance value when said first node is at said first logic level and has a small resistance value when said first node is at said second logic level;
    a first driving transistor for receiving, as an input, potential of said second node and controlling whether or not an output node is set at said first logic level; and
    a second driving transistor for receiving, as an input, a signal at a logic level identical to the logic level of said first node and controlling whether or not said output node is set at said second logic level.

2. The semiconductor integrated circuit of claim 1,
    wherein said second transistor sets said second node at said first logic level in accordance with said clock signal.

3. The semiconductor integrated circuit of claim 1, further comprising an inverter for inverting the logic level of said first node and outputting said inverted logic level,
    wherein said second transistor receives, as an input, an output signal of said inverter and sets said second node at said first logic level when said first node is at said first logic level.

4. The semiconductor integrated circuit of claim 1, further comprising a third transistor that receives, as an input, potential of said output node and sets said second node at said first logic level when said output node is at said second logic level.

5. The semiconductor integrated circuit of claim 1, further comprising a third transistor that receives, as an input, potential of said output node and sets said first node at said first logic level when said output node is at said second logic level.

6. The semiconductor integrated circuit of claim 1, further comprising:
    an inverter for inverting the logic level of said first node and outputting said inverted logic level; and
    a third transistor that receives, as an input, an output signal of said inverter and keeps a logic level of said first node when said first node is at said first logic level.

7. The semiconductor integrated circuit of claim 1, further comprising a third driving transistor that receives, as an input, potential of said first node and controls whether or not said output node is set at said first logic level.

8. The semiconductor integrated circuit of claim 1, wherein said first resistor device is a transistor whose gate and drain are connected to each other.

9. The semiconductor integrated circuit of claim 1, further comprising:
    an inverter for inverting the logic level of said first node and outputting said inverted logic level;
    a third transistor that receives, as an input, an output signal of said inverter and sets a third node at said second logic level when said first node is at said second logic level; and
    a second resistor device that is connected between said first node and said third node and has a small resistance value when said first node is at said first logic level and has a large resistance value when said first node is at said second logic level,
    wherein said second driving transistor receives, as an input, potential of said third node.

10. The semiconductor integrated circuit of claim 9, further comprising a third driving transistor that receives, as an input, potential of said first node and controls whether or not said output node is set at said second logic level.

11. The semiconductor integrated circuit of claim 9,
    wherein said second resistor device is a transistor whose gate and drain are connected to each other.

12. The semiconductor integrated circuit of claim 1, further comprising a third transistor that receives said clock signal as an input, is connected in series to said input circuit and is turned on when said clock signal is at said first logic level.

13. The semiconductor integrated circuit of claim 1,
    wherein said first logic level corresponds to a high logic level and said second logic level corresponds to a low logic level.

14. The semiconductor integrated circuit of claim 1,
    wherein said first logic level corresponds to a low logic level and said second logic level corresponds to a high logic level.

15. The semiconductor integrated circuit of claim 1,
    wherein said semiconductor integrated circuit is plural in number, and
    said first and second driving transistors included in said plural semiconductor integrated circuits together construct one logic circuit.

16. A semiconductor integrated circuit comprising:
    a first transistor for setting a first node at a first logic level when an input node is at said first logic level;
    a first resistor device that is connected between said input node and said first node and has a large resistance value when said input node is at said first logic level and has a small resistance value when said input node is at a second logic level different from said first logic level;
    a first driving transistor for receiving, as an input, potential of said first node and controlling whether or not an output node is set at said first logic level;
    a second driving transistor for receiving, as an input, a signal at a logic level identical to the logic level of said input node and controlling whether or not said output node is set at said second logic level; and
    an inverter for inverting the logic level of said input node and outputting said inverted logic level,
    wherein said first transistor receives, as an input, an output signal of said inverter and sets said first node at said first logic level when said input node is at said first logic level.

17. A semiconductor integrated circuit comprising:
    a first transistor for setting a first node at a first logic level when an input node is at said first logic level;

a first resistor device that is connected between said input node and said first node and has a large resistance value when said input node is at said first logic level and has a small resistance value when said input node is at a second logic level different from said first logic level;

a first driving transistor for receiving, as an input, potential of said first node and controlling whether or not an output node is set at said first logic level;

a second driving transistor for receiving, as an input, a signal at a logic level identical to the logic level of said input node and controlling whether or not said output node is set at said second logic level; and a third driving transistor for receiving, as an input, potential of said input node and controlling whether or not said output node is set at said first logic level.

18. A semiconductor integrated circuit comprising:

a first transistor for setting a first node at a first logic level when an input node is at said first logic level;

a first resistor device that is connected between said input node and said first node and has a large resistance value when said input node is at said first logic level and has a small resistance value when said input node is at a second logic level different from said first logic level;

a first driving transistor for receiving, as an input, potential of said first node and controlling whether or not an output node is set at said first logic level; and a second driving transistor for receiving, as an input, a signal at a logic level identical to the logic level of said input node and controlling whether or not said output node is set at said second logic level, wherein said first resistor device is a transistor whose gate and drain are connected to each other.

19. A semiconductor integrated circuit comprising:

a first transistor for setting a first node at a first logic level when an input node is at said first logic level;

a first resistor device that is connected between said input node and said first node and has a large resistance value when said input node is at said first logic level and has a small resistance value when said input node is at a second logic level different from said first logic level;

a first driving transistor for receiving, as an input, potential of said first node and controlling whether or not an output node is set at said first logic level;

a second driving transistor for receiving, as an input, a signal at a logic level identical to the logic level of said input node and controlling whether or not said output node is set at said second logic level an inverter for inverting the logic level of said input node and outputting said inverted logic level;

a second transistor for receiving, as an input, an output signal of said inverter and setting a second node at said second logic level when said input node is at said second logic level; and a second resistor device that is connected between said input node and said second node and has a small resistance value when said input node is at said first logic level and has a large resistance value when said input node is at said second logic level, wherein said second driving transistor receives, as an input, potential of said second node.

20. The semiconductor integrated circuit of claim 19, further comprising a third driving transistor for receiving, as an input, potential of said input node and controlling whether or not said output node is set at said second logic level.

21. The semiconductor integrated circuit of claim 19, wherein said second resistor device is a transistor whose gate and drain are connected to each other.

22. The semiconductor integrated circuit of claim 18, wherein said first logic level corresponds to a high logic level and said second logic level corresponds to a low logic level.

23. The semiconductor integrated circuit of claim 18, wherein said first logic level corresponds to a low logic level and said second logic level corresponds to a high logic level.

24. The semiconductor integrated circuit of claim 18, wherein said semiconductor integrated circuit is plural in number, and said first and second driving transistors included said plural semiconductor integrated circuits together construct one logic circuit.

* * * * *